US011239339B2

(12) United States Patent
Lin et al.

(10) Patent No.: US 11,239,339 B2
(45) Date of Patent: Feb. 1, 2022

(54) GATE STRUCTURE AND METHOD

(71) Applicant: Taiwan Semiconductor Manufacturing Co., Ltd., Hsinchu (TW)

(72) Inventors: Ta-Chun Lin, Hsinchu (TW); Jhon Jhy Liaw, Hsinchu County (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 57 days.

(21) Appl. No.: 16/397,248

(22) Filed: Apr. 29, 2019

(65) Prior Publication Data

US 2020/0343363 A1 Oct. 29, 2020

(51) Int. Cl.
*H01L 29/66* (2006.01)
*H01L 29/78* (2006.01)
(Continued)

(52) U.S. Cl.
CPC .. *H01L 29/66545* (2013.01); *H01L 21/02532* (2013.01); *H01L 21/3086* (2013.01); *H01L 21/76224* (2013.01); *H01L 21/76831* (2013.01); *H01L 21/823412* (2013.01); *H01L 21/823431* (2013.01); *H01L 21/823437* (2013.01); *H01L 21/823481* (2013.01); *H01L 21/823821* (2013.01); *H01L 27/0886* (2013.01); *H01L 27/0924* (2013.01); *H01L 29/0649* (2013.01);
(Continued)

(58) Field of Classification Search
CPC ............... H01L 27/088; H01L 27/092; H01L 21/76224; H01L 21/823412; H01L 21/823807; H01L 21/823828; H01L 29/0673; H01L 29/1033; H01L 29/42392; H01L 29/78696; H01L 27/0886; H01L 27/0924; H01L 21/823431; H01L 21/823821; H01L 29/66545; H01L 29/66795; H01L 29/785
See application file for complete search history.

(56) References Cited

U.S. PATENT DOCUMENTS 8,796,666 B1    8/2014  Huang et al.
8,815,712 B2    8/2014  Wan et al.
(Continued)

FOREIGN PATENT DOCUMENTS

TW    201807807 A    3/2018
TW    201913819 A    4/2019

*Primary Examiner* — Marcos D. Pizarro
(74) *Attorney, Agent, or Firm* — Haynes and Boone, LLP

(57) ABSTRACT

A semiconductor structure includes a first active region over a substrate and extending along a first direction, a gate structure over the first active region and extending along a second direction substantially perpendicular to the first direction, a gate-cut feature abutting an end of the gate structure, and a channel isolation feature extending along the second direction and between the first active region and a second active region. The gate structure includes a metal
(Continued)

electrode in direct contact with the gate-cut feature. The channel isolation feature includes a liner on sidewalls extending along the second direction and a dielectric fill layer between the sidewalls. The gate-cut feature abuts an end of the channel isolation feature and the dielectric fill layer is in direct contact with the gate-cut feature.

20 Claims, 17 Drawing Sheets

(51) Int. Cl.

| | |
|---|---|
| *H01L 29/06* | (2006.01) |
| *H01L 29/165* | (2006.01) |
| *H01L 27/088* | (2006.01) |
| *H01L 21/8234* | (2006.01) |
| *H01L 21/768* | (2006.01) |
| *H01L 21/762* | (2006.01) |
| *H01L 21/308* | (2006.01) |
| *H01L 21/02* | (2006.01) |
| *H01L 21/8238* | (2006.01) |
| *H01L 27/092* | (2006.01) |
| *H01L 29/786* | (2006.01) |

(52) U.S. Cl.
CPC ...... *H01L 29/165* (2013.01); *H01L 29/66795* (2013.01); *H01L 29/785* (2013.01); *H01L 29/78696* (2013.01)

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,786,507 B2 * | 10/2017 | Anderson | ....... H01L 21/823814 |
| 2011/0241098 A1 | 10/2011 | Park et al. | |
| 2016/0133632 A1 | 5/2016 | Park et al. | |
| 2016/0247730 A1 | 8/2016 | You et al. | |
| 2018/0350810 A1 | 12/2018 | Bergendahl et al. | |
| 2019/0057867 A1 | 2/2019 | Smith et al. | |
| 2019/0305099 A1 * | 10/2019 | Jo | ....................... H01L 29/0653 |
| 2019/0333914 A1 * | 10/2019 | Min | ..................... H01L 29/7848 |
| 2020/0135848 A1 * | 4/2020 | Lim | .................... H01L 27/0924 |

* cited by examiner

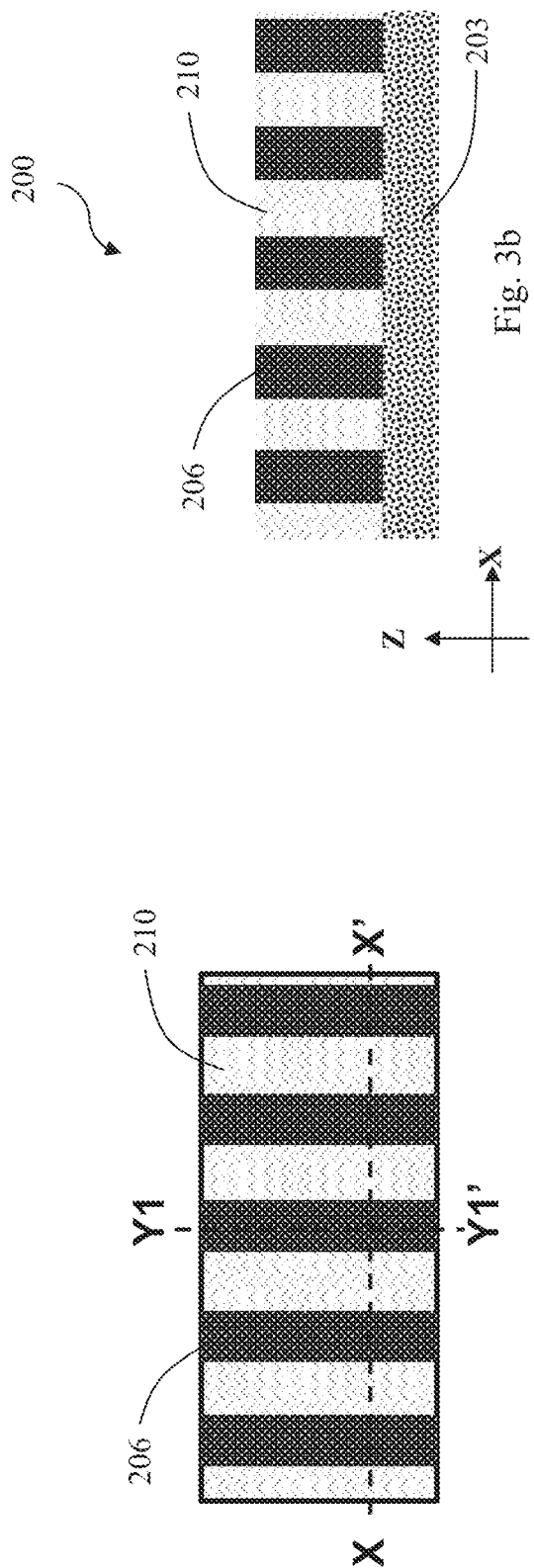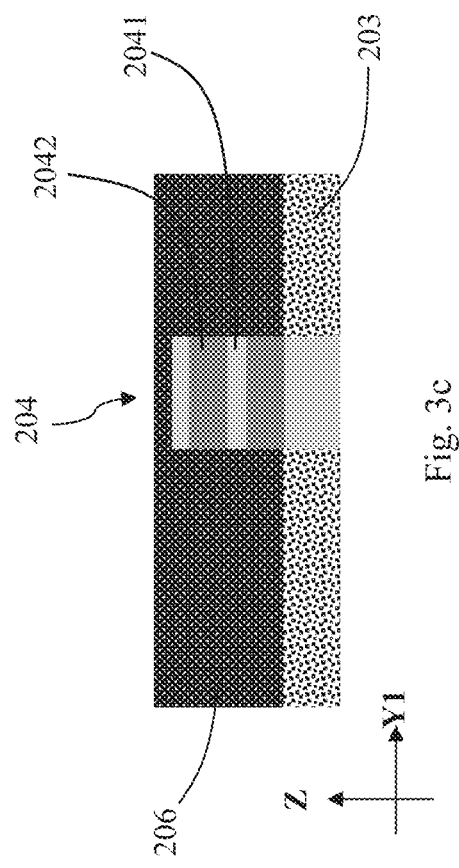

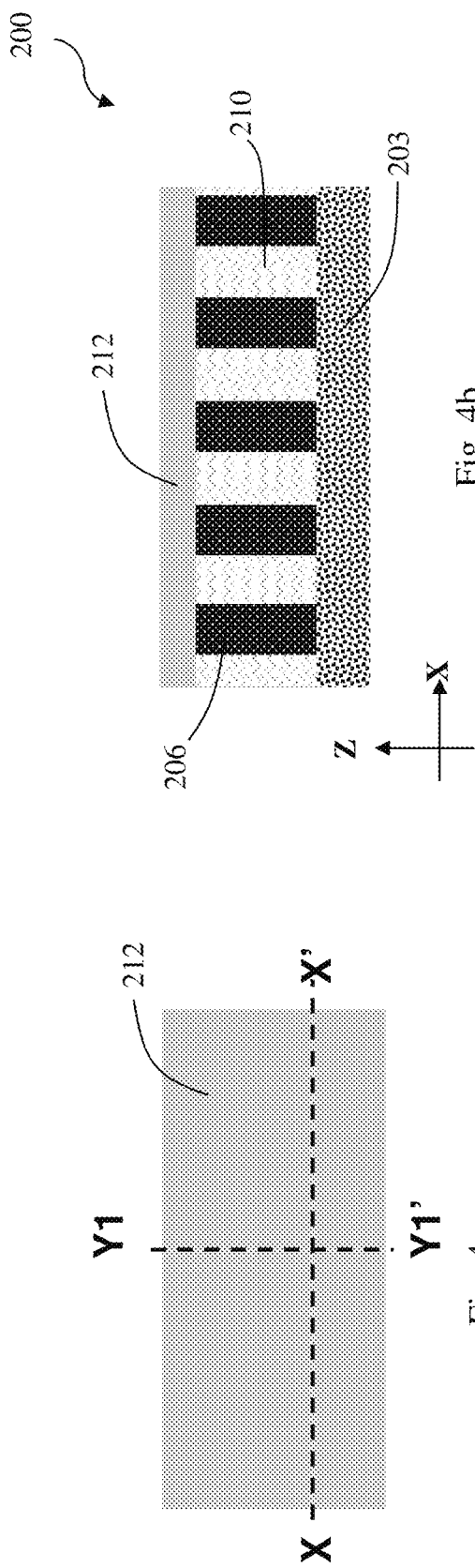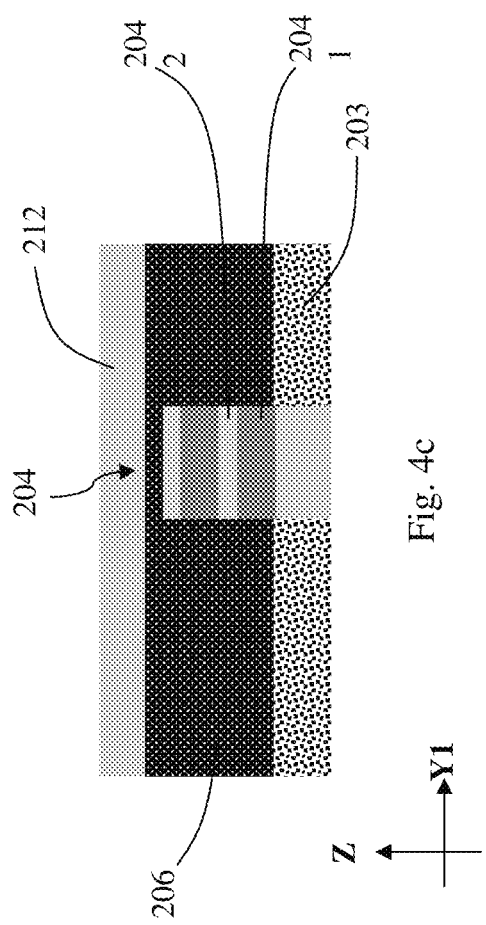

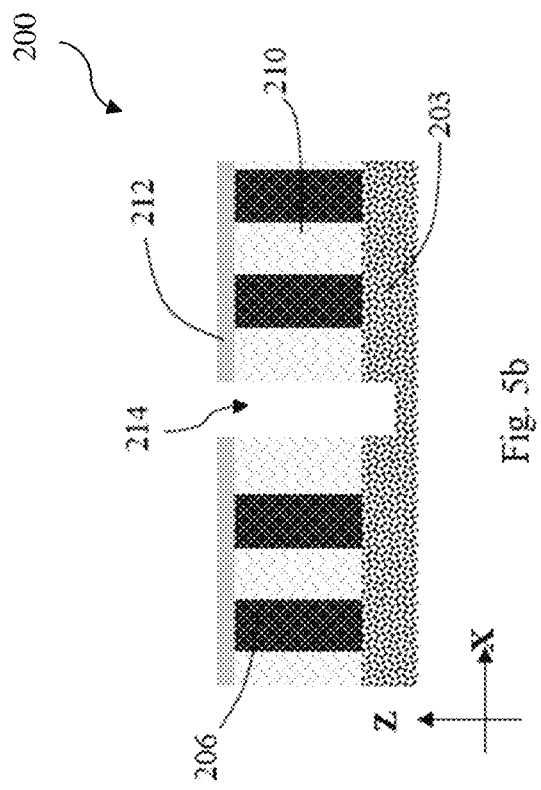
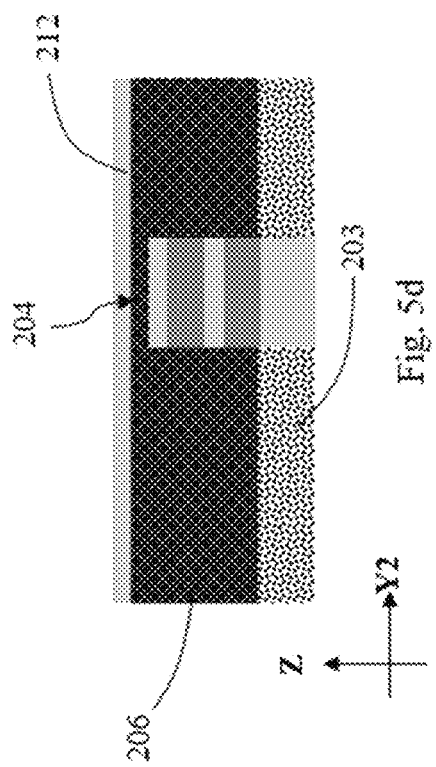
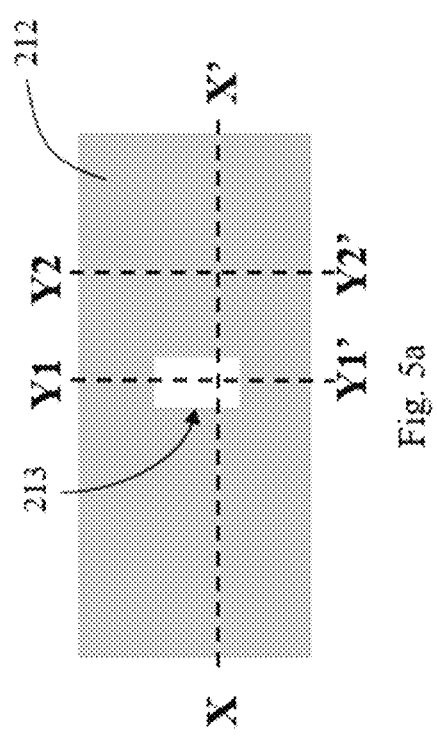
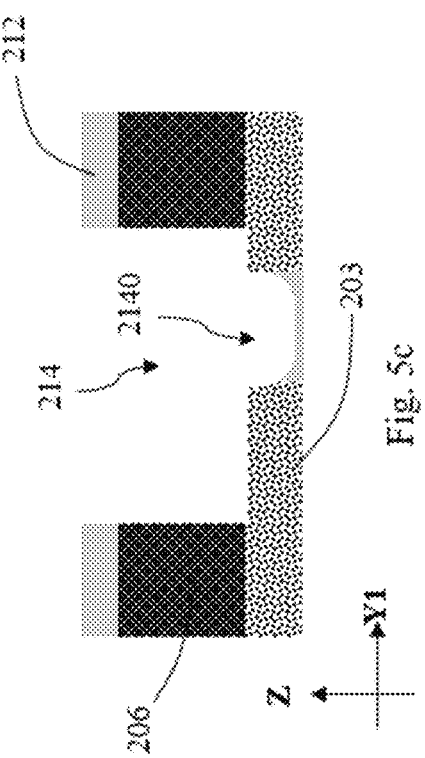
Fig. 5a
Fig. 5b
Fig. 5c
Fig. 5d

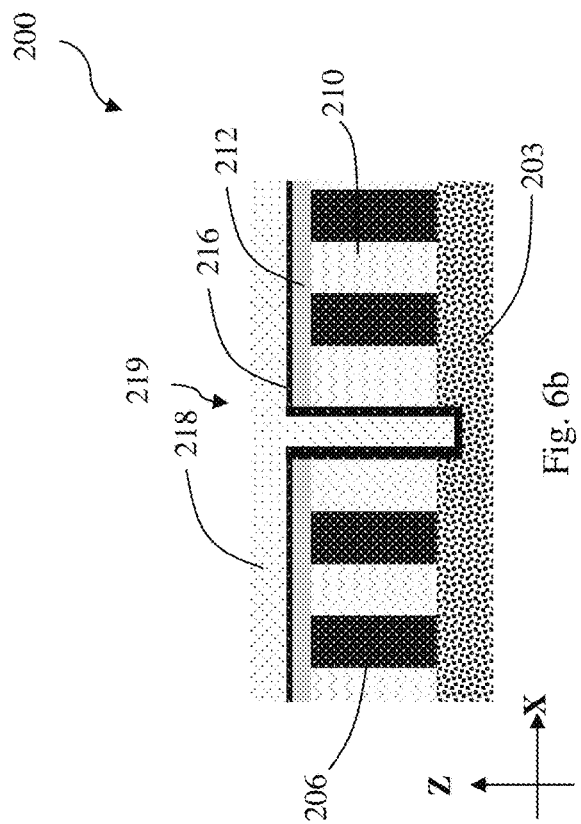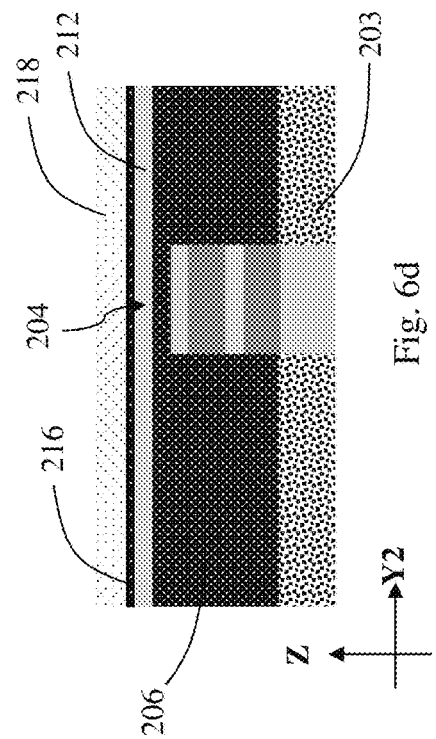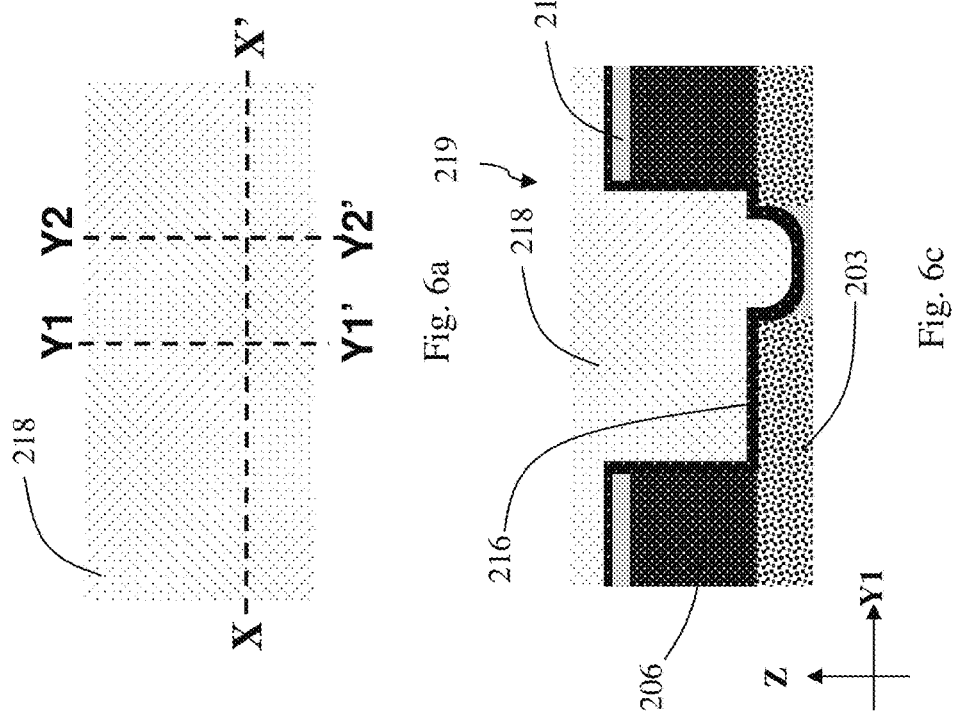
Fig. 6a
Fig. 6b
Fig. 6c
Fig. 6d

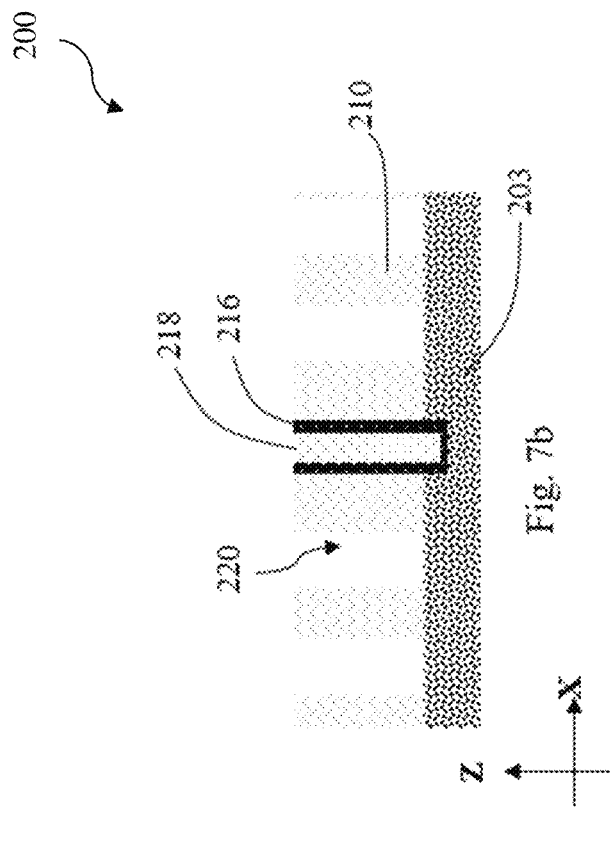
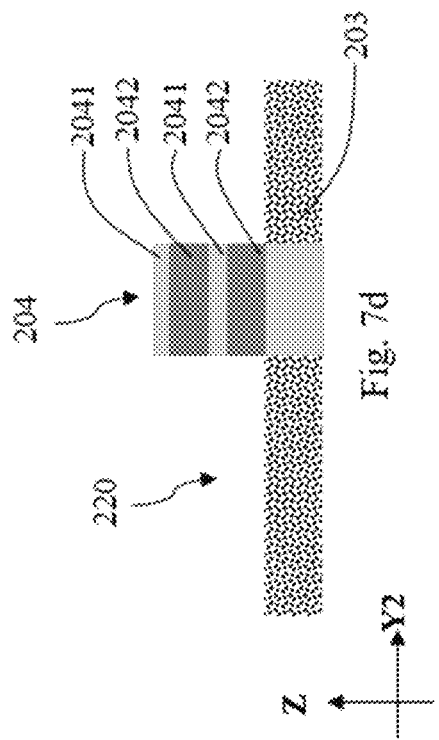
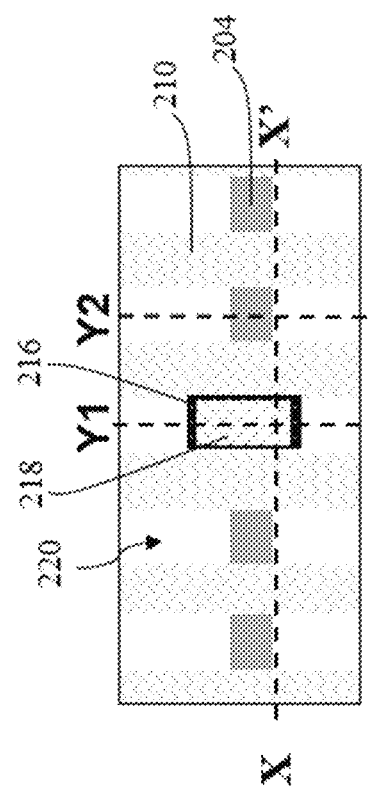
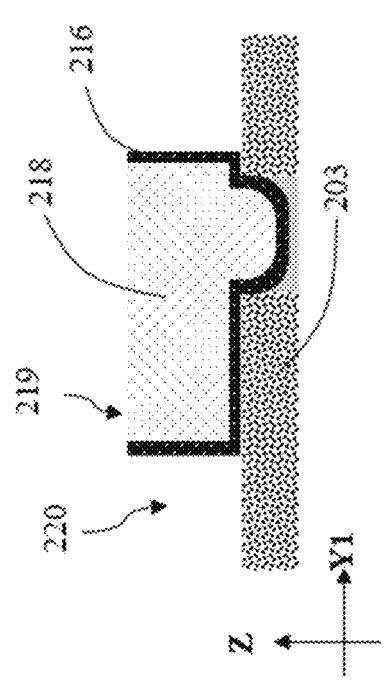

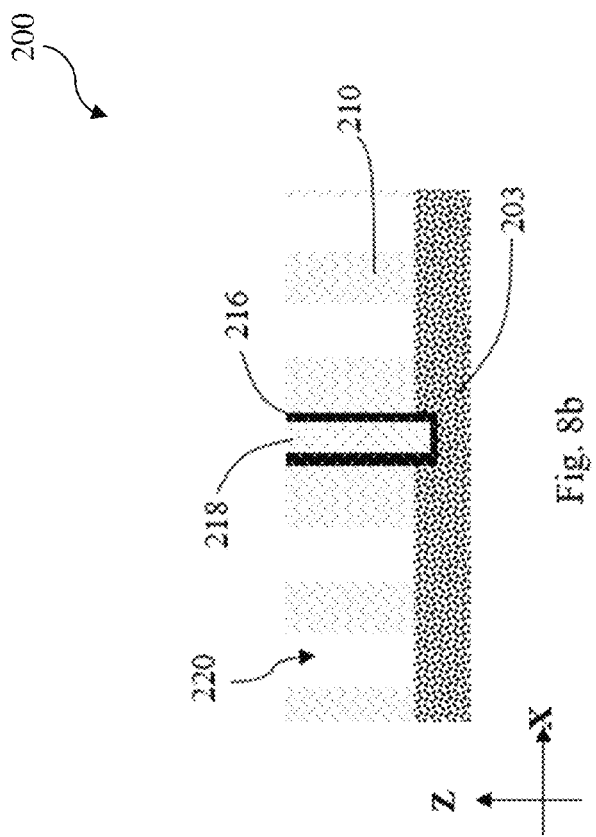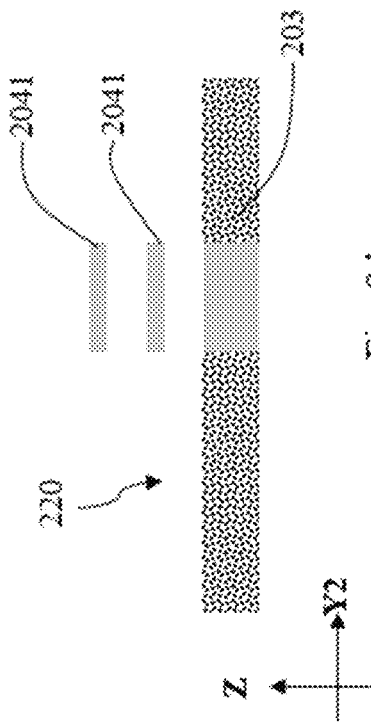
Fig. 8a
Fig. 8b
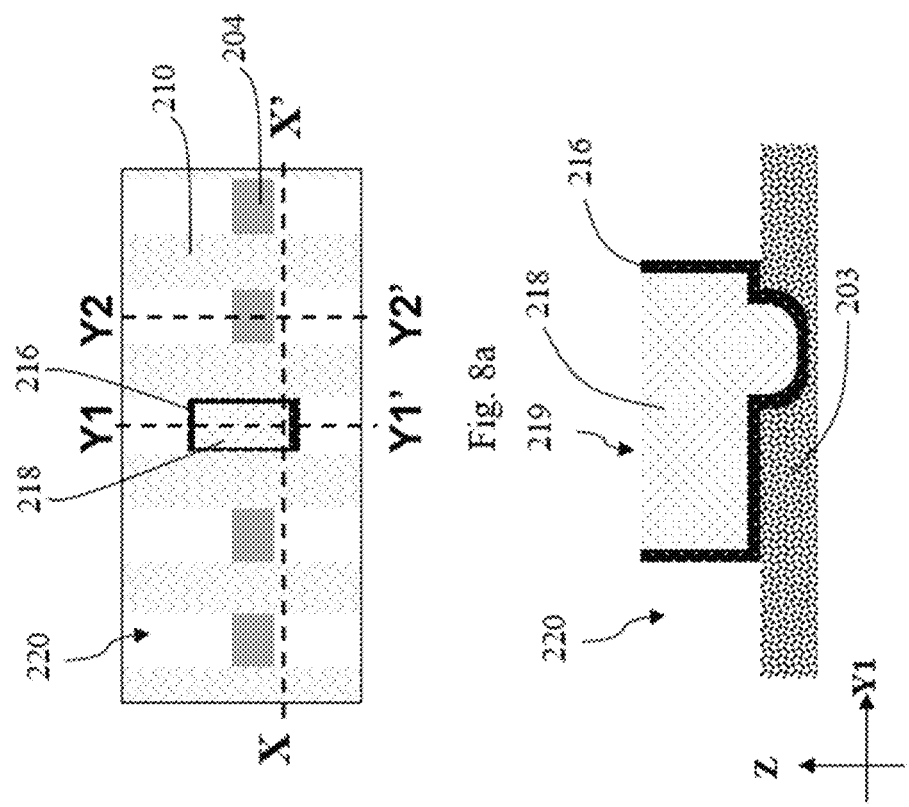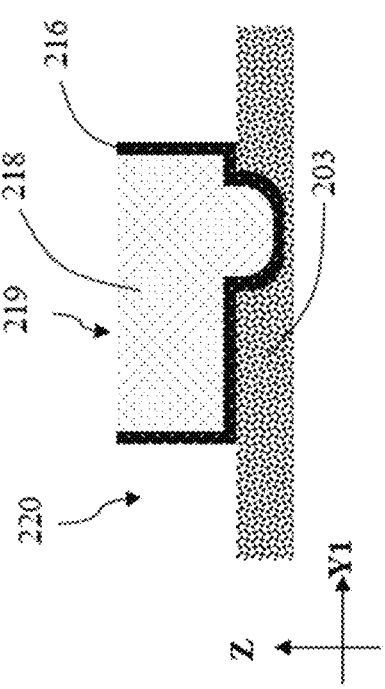
Fig. 8c
Fig. 8d

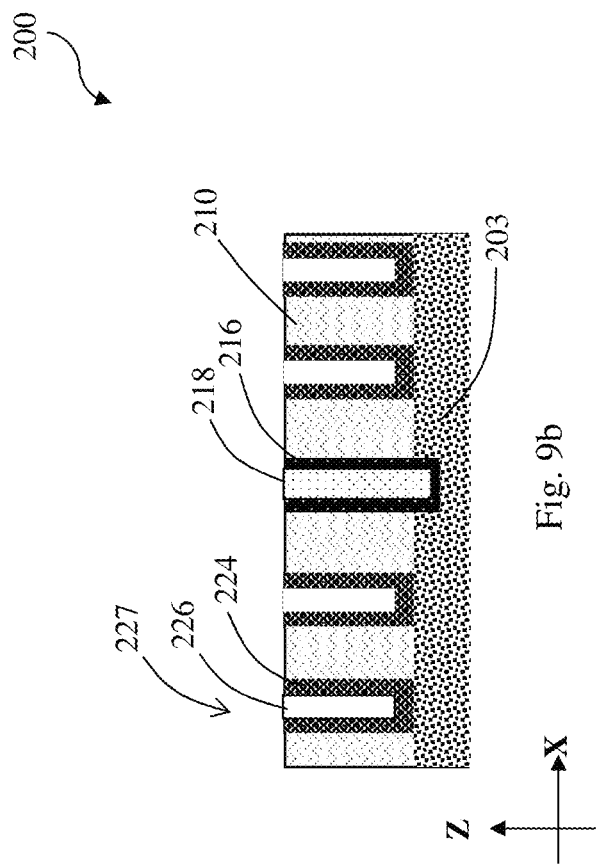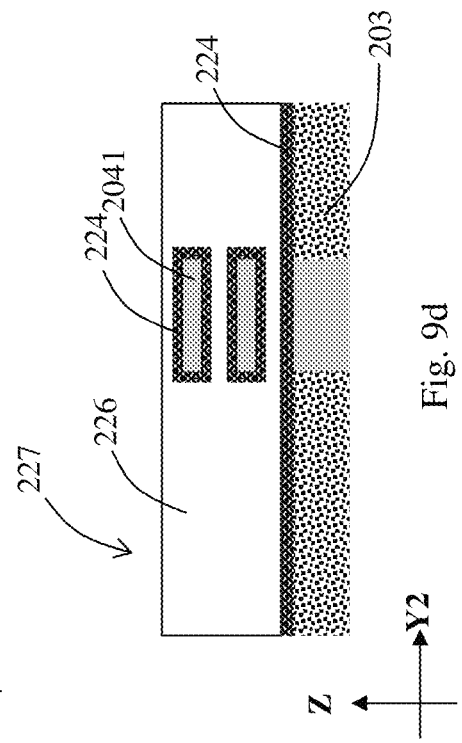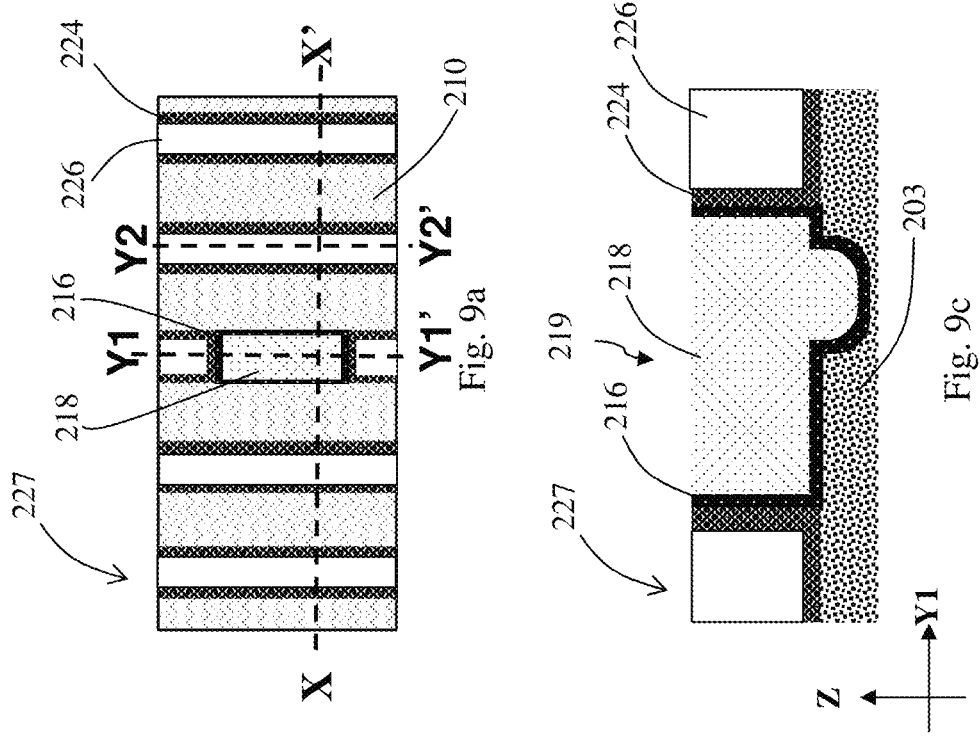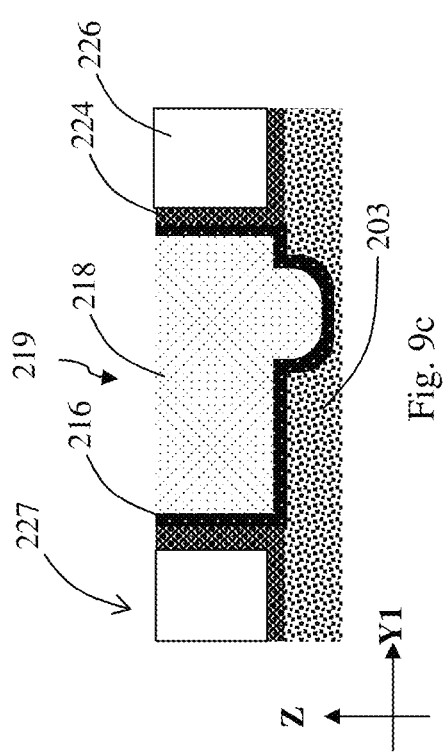

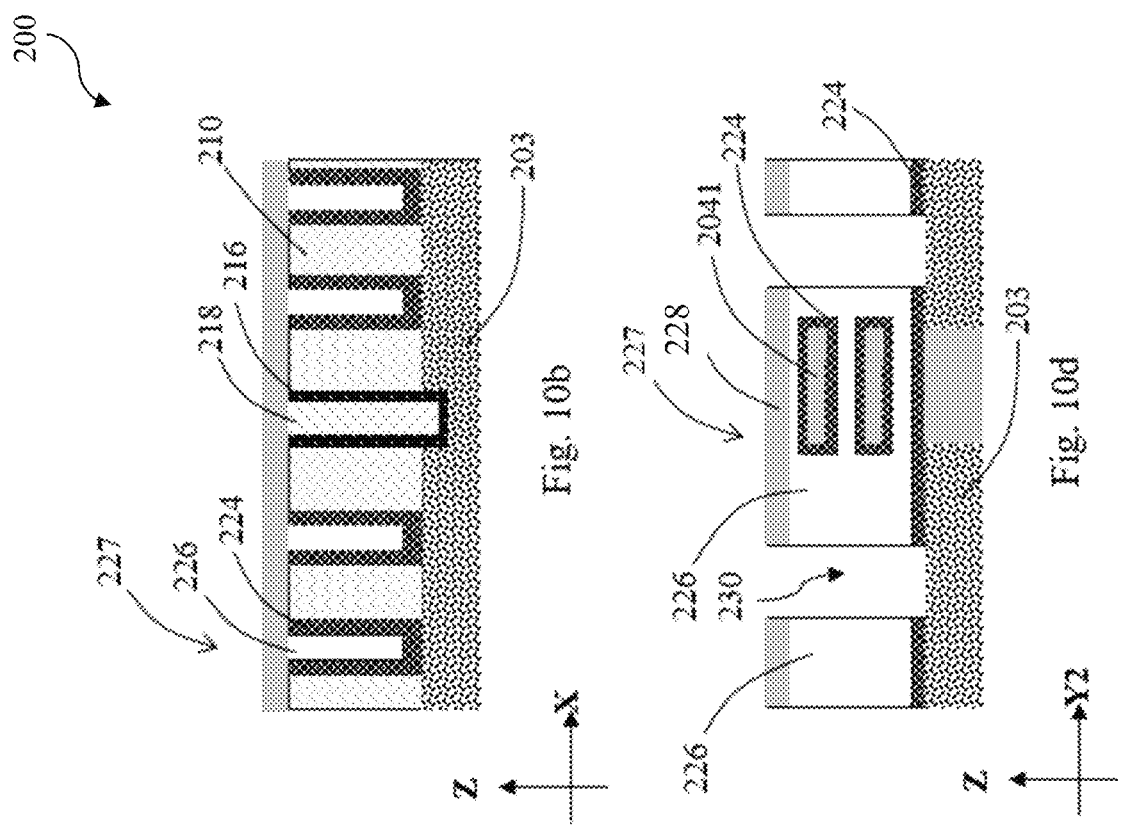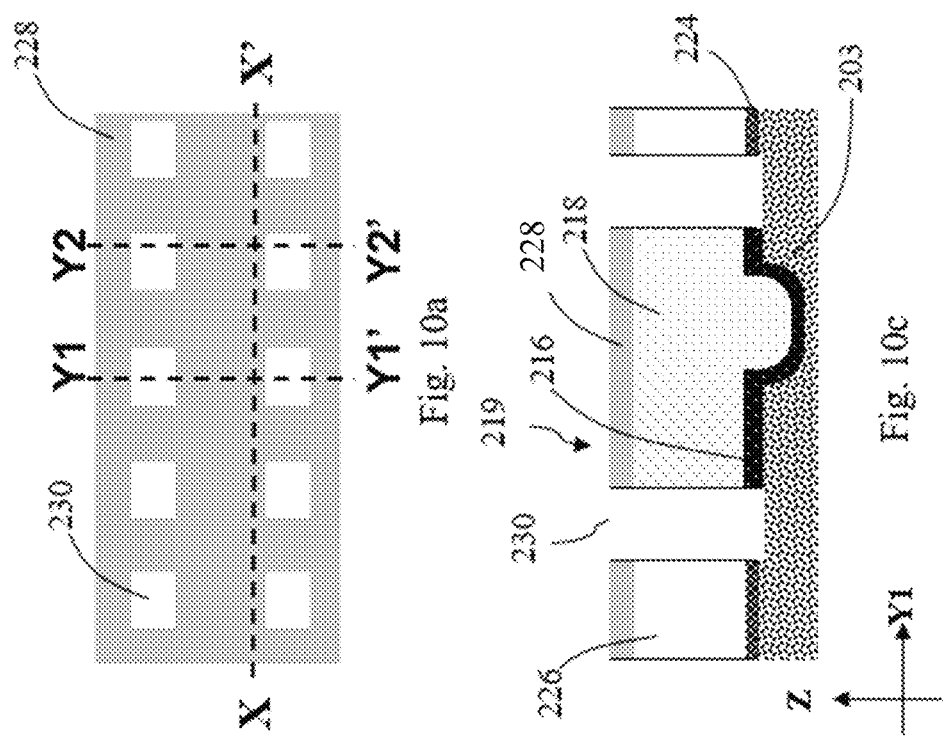

GATE STRUCTURE AND METHOD

BACKGROUND

An integrated circuit is formed on a semiconductor substrate and includes various devices, such as transistors, diodes, and/or resistors, configured and connected together to a functional circuit. Especially, the integrated circuit further includes field-effect transistors (FETs), such as metal-oxide-semiconductor FETs (MOSFETs) or complimentary MOSFETs, wherein each includes a gate electrode to control the active region of the corresponding FET. When a semiconductor device such as a MOSFET is scaled down through various technology nodes, high k dielectric material and metal are adopted to form a metal gate structure. However, in a method to form metal gate structures for n-type MOS (nMOS) transistors and p-type MOS (pMOS) transistors, various issues may arise when integrating the processes and materials for this purpose. For example, when a metal gate is formed through gate replacement, there is insufficient line-end process window since the gate dielectric layer is also formed on the sidewalls, leaving less opening to fill in with the metal or metal alloy to form the gate electrode. Furthermore, when forming the channel isolation trench for a gate-all-around (GAA) FETs after the metal gate structures are already formed, the removal of the metal gate electrode, the gate dielectric layer, and channel members may require prolonged etch time, thereby damaging device performance and lowering production yield. It is therefore desired to have a new device structure and a method of making the same to address the above concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2a, 3a, 4a, 5a, 6a, 7a, 8a, 9a, 10a, and 11a are diagrammatic top views of the semiconductor structure at various fabrication stages constructed according to some embodiments of the present disclosure.

FIGS. 2b, 3b, 4b, 5b, 6b, 7b, 8b, 9b, 10b, and 11b are diagrammatic cross-sectional views of the semiconductor structure in FIGS. 2a, 3a, 4a, 5a, 6a, 7a, 8a, 9a, 10a, and 11a along section X-X' at various fabrication stages constructed according to some embodiments of the present disclosure.

FIGS. 2c, 3c, 4c, 5c, 6c, 7c, 8c, 9c, 10c, and 11c are diagrammatic cross-sectional views of the semiconductor structure in FIGS. 2a, 3a, 4a, 5a, 6a, 7a, 8a, 9a, 10a, and 11a along section Y1-Y1' at various fabrication stages constructed according to some embodiments of the present disclosure.

FIGS. 5d, 6d, 7d, 8d, 9d, 10d, and 11d are diagrammatic cross-sectional views of the semiconductor structure in FIGS. 5a, 6a, 7a, 8a, 9a, 10a, and 11a along section Y2-Y2' at various fabrication stages constructed according to some embodiments of the present disclosure.

DETAILED DESCRIPTION

Figure 1:
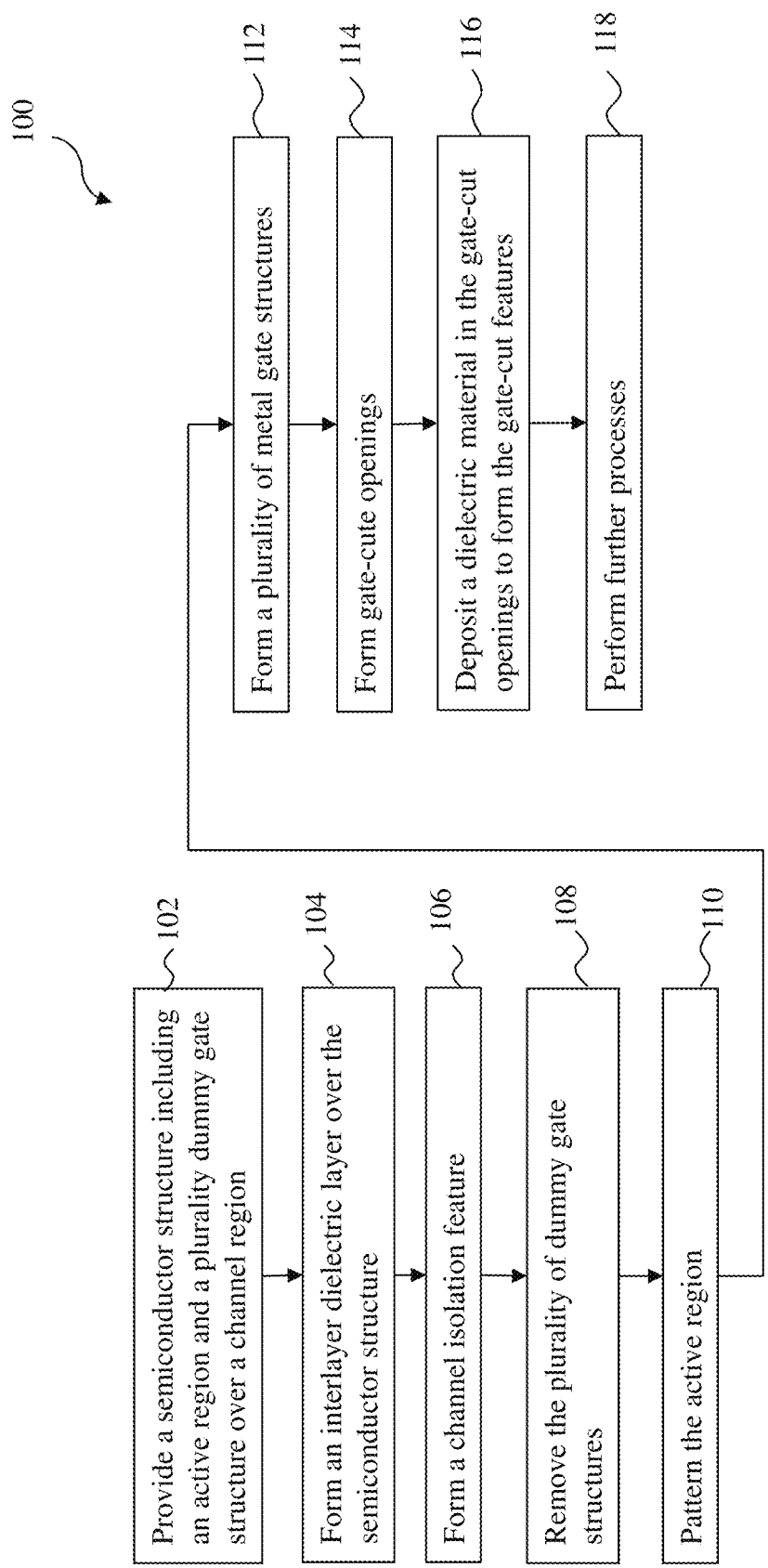
FIG. 1 is a flowchart of a method making a semiconductor structure having a multi-fin structure constructed according to various aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure provides various embodiments of a semiconductor structure formed on a semiconductor substrate. The semiconductor structure includes various devices, such as field-effect transistors (FETs) having metal gate structures with the gate dielectric layer of a high-k dielectric material and the gate electrode of metal or metal alloy. The semiconductor structure further includes channel isolation features and gate-cut features integrated with the metal gate structures. In some conventional methods, the channel isolation features and gate-cut features are formed before the polysilicon dummy gates are replaced with functional metal gate structure. In those conventional methods, the fill window for gate dielectrics and gate electrodes between the active regions and the gate-cut features can be too small to form a reliable gate electrode, leading to low yield. In some other conventional methods where the channel isolation features are formed after the metal gate structures are formed, it can be difficult to etch through the active regions of a GAA FETs to form the channel isolation trenches for channel isolation features. In some embodiments, the present disclosure provides a method where the channel isolation features are formed before formation of the metal gates and gate-cut features are formed after formation of the metal gates to reduce process complexity and to enlarge process window, thereby improving production yield and device performance.

FIG. 1 is a flowchart of a method 100 for fabricating a semiconductor structure having fin-type (FinFET) or GAA FETs and metal gate structure constructed according to some embodiments. Method 100 includes blocks 102, 104, 106, 108, 110, 112, 114, 116, and 118. Method 100 will be described in conjunction with diagrammatic top views and cross-sectional views of a semiconductor structure 200 shown in FIGS. 2a~11a, 2b~11b, 2c~11c, and 5d~11d. FIGS. 2a~11a are diagrammatic top views of the semiconductor structure 200. FIGS. 2b~11b are diagrammatic cross-sectional views of the semiconductor structure in FIGS. 2a~11a along section X-X'. FIGS. 2c~11c are diagrammatic cross-sectional views of the semiconductor structure in FIGS. 2a~11a along section Y1-Y1'. FIGS. 5d~11d are diagrammatic cross-sectional views of the semiconductor structure in FIGS. 5a~11a along section Y2-Y2'. Additional steps may be provided before, during, and after method 100, and some of the steps described can be moved, replaced, eliminated for additional embodiments of method 100.

Figure 2A:
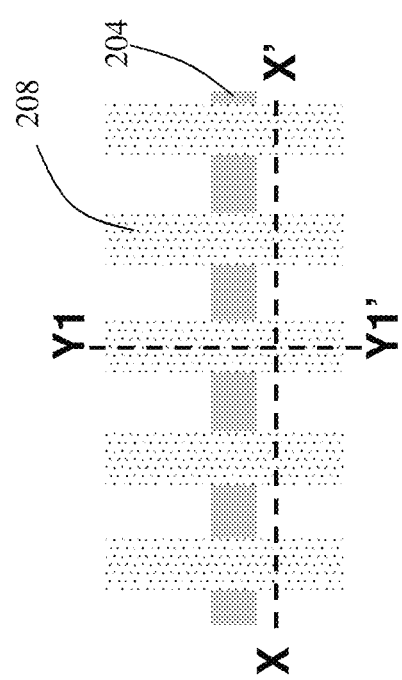
Figure 2B:
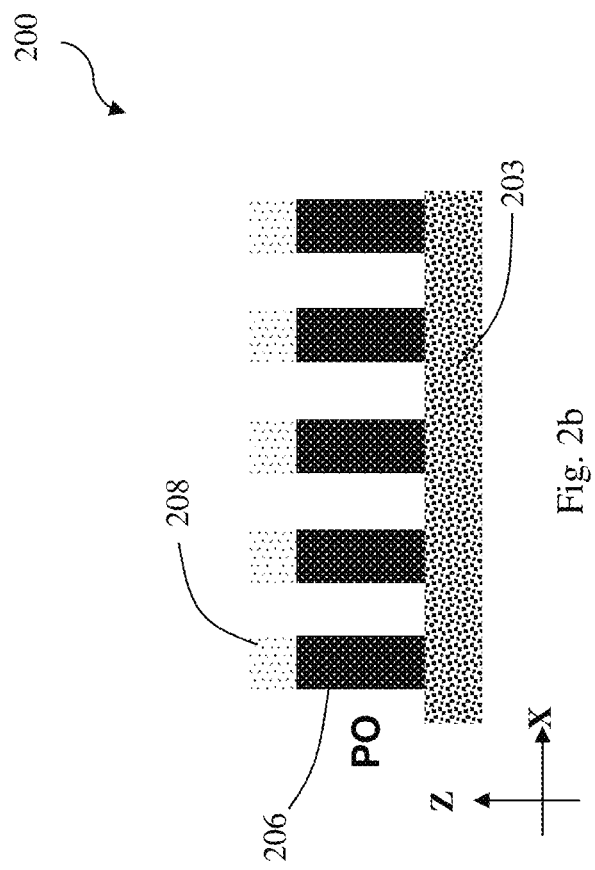
Figure 2C:
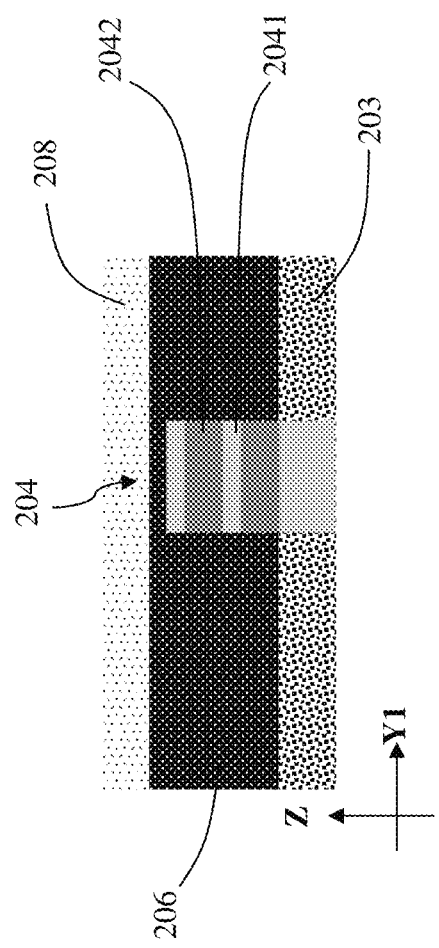
Figure 11A:
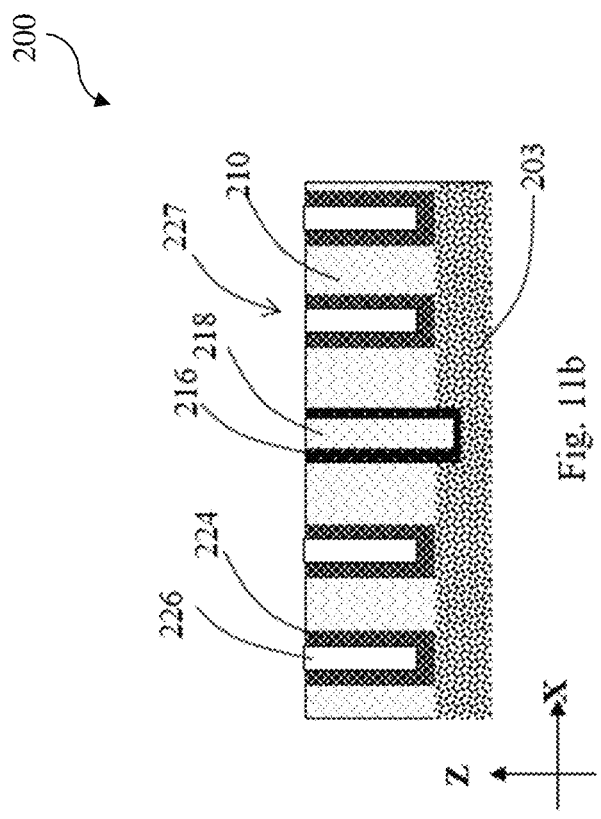
Figure 11B:
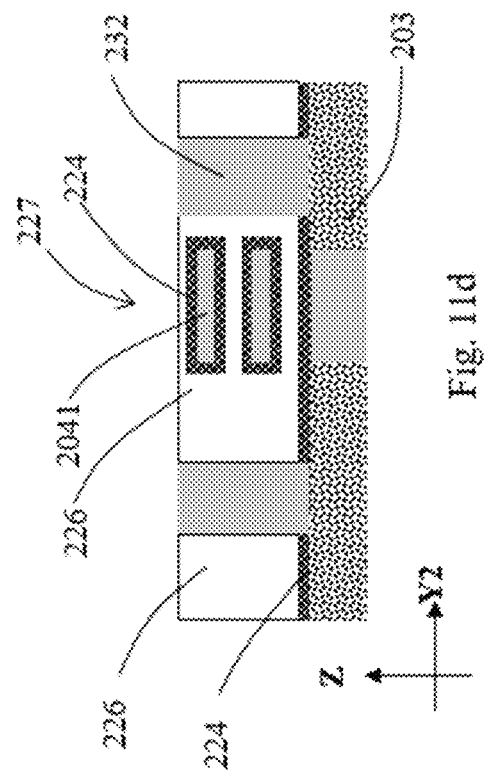
Figure 11C:
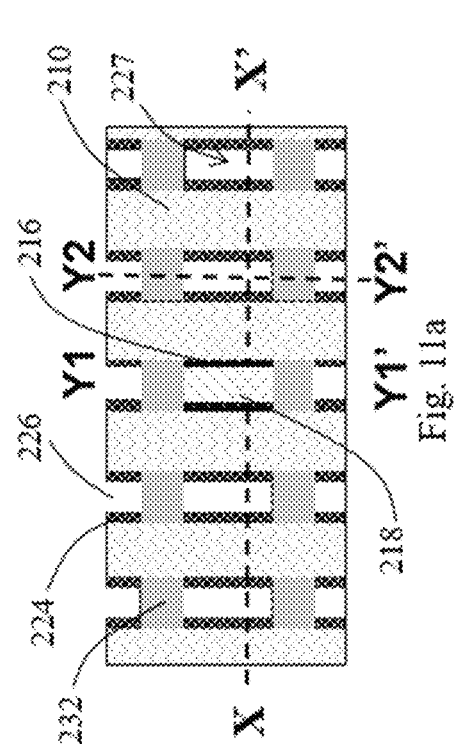
Figure 11D:
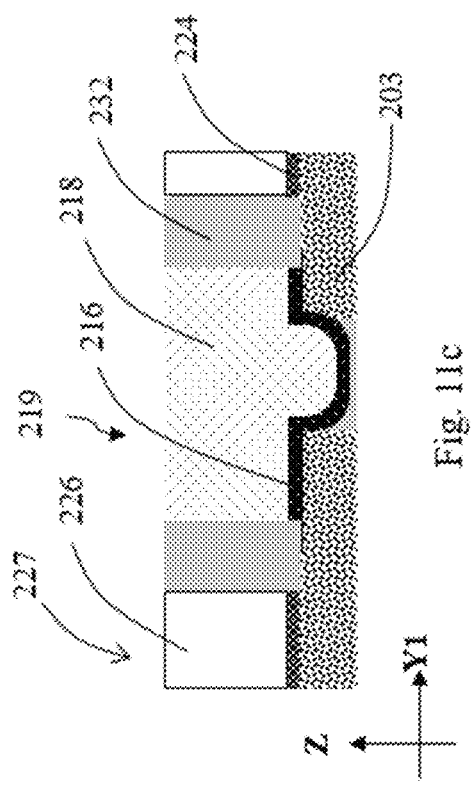

Referring to FIG. 1 and FIGS. 2a, 2b and 2c, the method 100 includes a block 102 where a semiconductor structure 200 is provided. The semiconductor structure 200 includes an active region 204 and a plurality of dummy gate structures 206 over the active region 204. The semiconductor structure 200 illustrated in FIGS. 2a, 2b and 2c are fabricated on a substrate, which is not shown for simplicity. The substrate includes germanium, silicon germanium or other proper semiconductor materials. The substrate may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The substrate may also include various doped regions such as n-well and p-wells. In one embodiment, the substrate includes an epitaxy (or epi) semiconductor layer. In another embodiment, the substrate includes a buried dielectric material layer for isolation formed by a proper technology, such as a technology referred to as separation by implanted oxygen (SIMOX). In some embodiments, the substrate may be a semiconductor on insulator, such as silicon on insulator (SOI).

Still referring to FIGS. 2a, 2b and 2c, the semiconductor structure 200 includes the active region (or semiconductor feature) 204, which is to be formed into channel regions and source/drain regions of one or more field effect transistors (FETs). The active region 204 protrudes from the substrate and includes a bottom portion embedded in an isolation feature 203, which may also be referred to as shallow trench isolation (STI) features 203. In various embodiments, the active region 204 may be formed by patterning the substrate or alternatively, patterning one or more epitaxial layers formed on the substrate. In the embodiments represented in FIG. 2c, the active region 204 is formed from alternatingly stacked layers of different semiconductor layers. In one example, the alternatingly stacked semiconductor layers include multiple first semiconductor layers interleaved with multiple second semiconductor layers in an alternating manner. In some implementations, the first semiconductor layer includes silicon and the second semiconductor layer include germanium. In some instances, a hard mask is then deposited on the alternatingly stacked semiconductor layers and is patterned by lithography process. The hard mask layers include a dielectric such as semiconductor oxide, semiconductor nitride, semiconductor oxynitride, and/or semiconductor carbide, and in an exemplary embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes. A photoresist layer (or resist) used to define the fin structure may be formed on the hard mask layer. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the semiconductor structure 200 by the lithography process. After patterning the resist, an etching process is performed on the semiconductor structure 200 to open the hard mask layer, thereby transferring the pattern from the resist layer to the hard mask layer. The remaining resist layer may be removed after the patterning the hard mask layer. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The etching process may include multiple etching steps. For example, the silicon oxide film in the hard mask layer may be etched by a diluted hydrofluorine solution and the silicon nitride film in the hard mask layer may be etched by a phosphoric acid solution.

Then etching process is followed to etch the portions of the alternatingly stacked semiconductor layers not covered by the patterned hard mask layer. The patterned hard mask layer is used as an etch mask during the etching processes to pattern the alternatingly stacked semiconductor layers. The etching processes may include any suitable etching technique such as dry etching, wet etching, and/or other etching methods (e.g., reactive ion etching (RIE)). In some embodiments, the etching process includes multiple etching steps with different etching chemistries, designed to etching the alternatingly stacked semiconductor layers to form the trenches with particular trench profile for improved device performance and pattern density. In some examples, the semiconductor materials of the alternatingly stacked semiconductor layers may be etched by a dry etching process using a fluorine-based etchant. After the etching processes, the active regions 204 are defined on the substrate.

One or more dielectric material is then filled in the trenches, which are defined between adjacent active regions 204, to form the STI feature 203. Suitable fill dielectric materials include semiconductor oxides, semiconductor nitrides, semiconductor oxynitrides, fluorinated silica glass (FSG), low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process. The deposition of the dielectric material may be followed by a chemical mechanical polishing/planarization (CMP) process to remove the excess dielectric material and planarize the top surface of the semiconductor structure. The CMP process may use the hard mask layers as a polishing stop layer to prevent polishing the active region 204.

The STI feature 203 is then pulled back or recessed such that the active regions 204 protrude above the STI features 203. The pulling back/recess process employs one or more etching steps (such as dry etch, wet etch or a combination thereof) to selectively etch back the STI features 203. For example, a wet etching process using hydrofluoric acid may be used to etch when the STI features 203 are silicon oxide. Exemplary active regions 204 in FIGS. 2a, 2b, and 2c extend along X direction and are spaced from one another along Y direction. In some implementations, the pulling back of the STI feature 203 may also remove the hard mask on top of the active region 204. In the embodiments where the alternatingly stacked semiconductor layers include silicon layers and germanium layer and are formed on the substrate, the active region 204 include silicon layers 2041 interleaved by germanium layers 2042, as shown in FIG. 2c. In some instances, the silicon layers 2041 may be formed into channel members of a GAA device, such as a nano-wire GAA transistor or a nano-sheet GAA transistor.

Still referring to FIGS. 2a, 2b and 2c, the semiconductor structure 200 also includes a plurality of dummy gate structures 206. The dummy gate structures 206 have elongated shapes and are oriented in the Y direction. Each of the dummy gate structures 206 is disposed over one or more active regions 204 (one is shown in FIG. 2a). The dummy gate structures 206 may each include a dummy gate dielectric layer and a dummy gate electrode over the dummy gate dielectric layer. The dummy gate dielectric layer includes a dielectric material, such as silicon oxide and the dummy gate electrode includes polysilicon. The dummy gate structures 206 may also be referred to as placeholder gate structures because they are to be replaced by a metal gate structure, such as a metal gate structure 227, described below. The formation of the dummy gate structures 206 includes depositing the dummy gate materials (including forming silicon oxide and polysilicon in the present example); and patterning the dummy gate materials by a lithographic process and etching. A hard mask layer 208 may be formed on the dummy gate materials and is used as an etch mask during the formation of the dummy gate structures 206. The hard mask layer 208 may include any suitable material, such as a silicon oxide, a silicon nitride, a silicon carbide, a silicon oxynitride, other suitable materials, and/or combinations thereof. In one embodiment, the hard mask layer 208 includes multiple films, such as silicon oxide and silicon nitride. In some embodiments, the patterning process to form the dummy gate structures 206 includes forming a patterned resist layer by lithography process; etching the hard mask layer 208 using the patterned resist layer as an etch mask; and etching the dummy gate materials to form the dummy gate structures 206 using the patterned hard mask layer as an etch mask.

One or more gate spacers (not shown for simplicity) are formed on the sidewalls of the dummy gate structures 206. The gate spacers may be used to offset the subsequently formed source/drain features and may be used for designing or modifying the source/drain structure profile. The gate spacers may include any suitable dielectric material, such as a semiconductor oxide, a semiconductor nitride, a semiconductor carbide, a semiconductor oxynitride, other suitable dielectric materials, and/or combinations thereof. The gate spacers may include multiple films, such as two films (a silicon oxide film and a silicon nitride film) or three films ((a silicon oxide film; a silicon nitride film; and a silicon oxide film). The formation of the gate spacers includes deposition and anisotropic etching, such as dry etching.

Although not clearly shown in FIGS. 2a, 2b and 2c, the semiconductor structure 200 may include source/drain features adjacent to the plurality of dummy gate structures 206. The source and drain may include both light doped drain (LDD) features and heavily doped source and drain (S/D). In some embodiments, multiple field effect transistors (FETs) may be formed on the semiconductor structure and each field effect transistor includes source/drain features formed on the respective active region 204, which is interposed by one of the dummy gate structure 206. A channel region is formed in a portion of the active region 204 that is underlying the corresponding dummy gate structure 206. A channel region is laterally sandwiched between two source/drain features.

The source/drain features may be formed by selective epitaxy growth for strain effect with enhanced carrier mobility and device performance. The dummy gate structures 206 and the gate spacer define the source/drain region where the source/drain features are formed. In some embodiments, the source/drain features are formed by one or more epitaxy processes, whereby Si features, SiGe features, SiC features, and/or other suitable features are grown in crystalline state on the active regions 204. Alternatively, an etching process is applied to recess the source/drain regions before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the active regions 204.

The source/drain features may be in-situ doped during the epitaxy process by introducing doping species including: p-type dopants, such as boron or $BF_2$; n-type dopants, such as phosphorus or arsenic; and/or other suitable dopants including combinations thereof. If the source and drain are not in-situ doped, an implantation process (i.e., a junction implant process) is performed to introduce the corresponding dopant into the source and drain. In an exemplary embodiment, the source/drain features in an nFET include SiC or Si doped with phosphorous, while those in a pFET include Ge or SiGe doped with boron. In some other embodiments, the source/drain features include more than one semiconductor material layers. For example, a silicon germanium layer is epitaxially grown over the substrate within the source/drain regions and a silicon layer is epitaxially grown on the silicon germanium layer. One or more annealing processes may be performed thereafter to activate the source/drain features. Suitable annealing processes include rapid thermal annealing (RTA), laser annealing processes, other suitable annealing technique or a combination thereof.

Referring to FIG. 1 and FIGS. 3a~3c, the method 100 includes a block 104 where an interlayer dielectric layer (ILD) layer 210 is formed over the semiconductor structure 200. FIG. 3a is a diagrammatic top view of the semiconductor structure 200. FIG. 3b is a diagrammatic cross-sectional view of the semiconductor structure 200 in FIG. 3a along section X-X' and FIG. 3c is a diagrammatic cross-sectional view of the semiconductor structure 200 in FIG. 3a along section Y1-Y1'. The ILD layer 210 is disposed in the space between neighboring dummy gate structures 206. The ILD layer 210 and the gate spacer define gate trenches after the removal of the dummy gate structures 206 and the metal gate structures are to be formed in the gate trenches. The ILD layer 210 may also be part of an electrical interconnect structure that electrically interconnects various devices of the semiconductor structure 200. In such embodiments, the ILD layer 210 acts as an insulator that supports and isolates the conductive traces, conductive lines, and via contacts. The ILD layer 210 may include any suitable dielectric material, such as a semiconductor oxide, a semiconductor nitride, a semiconductor oxynitride, other suitable dielectric materials, or combinations thereof. In some embodiments, the formation of the ILD layer 210 includes deposition and CMP to provide a planarized top surface. The hard mask 208 may be removed at this stage, such as by the CMP or an additional etching process.

Referring to FIG. 1 and FIGS. 4a~4c, 5a~5d and 6a~6d, the method 100 includes a block 106 where a channel isolation feature 219 is formed. Reference is first made to FIGS. 4a~4c, the block 106 includes forming a hard mask 212 over the planarized top surface of the semiconductor structure 200. The hard mask 212 is then patterned by lithography process and etching to form a patterned hard mask 212 shown in FIGS. 5a~5d with one or more openings 213. The semiconductor structure 200 is then etched using the patterned hard mask 212 as the etch mask to form one or more channel isolation trench 214 through one or more dummy gate structures 206, a portion of the ILD layer 210, a portion of the STI feature 203, and a portion of the active region 204. In some embodiments represented in FIG. 5c, the etching process is selected to etch the active region 204 faster such that the active region 204 is over-etched to have a bottom surface lower than the STI feature 203 to form the recess 2140. This ensures that the active region 204 is severed and separated into segments over the STI feature 203. Each of the severed and isolated segments may become a separate active region and may include multiple channel members.

Reference is now made to FIGS. 6a~6d. Dielectric materials are deposited over the semiconductor structure 200, including within the channel isolation trench 214 to form the channel isolation feature 219. A channel isolation feature 219 severs and separates the active region 204 into two active regions. In some embodiments, the channel isolation feature 219 includes one than one layer deposited using atomic layer deposition (ALD), chemical vapor deposition (CVD), or other suitable deposition techniques. In some implementations, a semiconductor oxide material is first conformally deposited to form a first dielectric layer 216 as a liner and a dielectric material is deposited over the first dielectric layer 216 to form a second dielectric layer 218 as a dielectric fill layer. In some instances, the semiconductor oxide material for the first dielectric layer 216 (or liner 216) includes silicon oxide and the dielectric material for the second dielectric layer 218 includes silicon nitride, silicon oxynitride, silicon oxycarbonitride, silicon carbonitride, silicon oxycarbide, or a combination thereof. The first dielectric layer 216 functions as a liner as it attaches to the active region 204 better than the second dielectric layer 218 and isolates the second dielectric layer 218 from the active region 204 to prevent unintended surface charging or stress resulting from direct contact between the second dielectric layer 218 and the active region 204. While not explicitly shown in FIGS. 6a~6d, the first dielectric layer 216 and the second dielectric layer 218 are planarized to remove the hard mask 212 such that top surfaces of the ILD layer 210, the dummy gate structures 206, the first dielectric layer 216, and the second dielectric layer 218 are coplanar.

Referring to FIG. 1 and FIGS. 7a~7d, the method 100 includes a block 108 where the plurality of dummy gate structures 206 are removed. In some embodiments, the dummy gate structures 206 are removed by an etching process, such as a wet etch, a dry etch, or a combination thereof, to selectively remove the dummy gate structures 206. The etching process may include multiple etching steps to remove the dummy gate structures if the dummy gate structures 206 includes more than one layers, such as a dummy gate dielectric layer and a dummy electrode. In some embodiments represented in FIGS. 7a~7d, the removal of the dummy gate structures 206 leaves behind a plurality of gate trenches 220. In some instances, the gate trenches 220 expose the first dielectric layer 216 on the sidewalls of the channel isolation feature 219, as shown in FIG. 7c. In addition, the gate trenches 220 expose the active regions 204, as shown in FIG. 7d. In embodiments where the active region 204 includes alternatingly stacked layers of silicon layers 2041 and germanium layers 2042, the silicon layers 2041 and germanium layers 2042 are exposed in the gate trenches 220. In some embodiments, the operations at block 108 do not remove the first dielectric layer 216 of the channel isolation feature 219 and the first dielectric layer 216 is exposed in the gate trenches 220. In some alternative embodiments, the operations at block 108 remove the first dielectric layer 216 on either ends of the channel isolation feature 219 along Y direction (Y1) such that the second dielectric layer 218 is exposed in the gate trenches 220.

Referring to FIG. 1 and FIGS. 8a~8d, the method 100 includes a block 110 where the active region 204 is patterned. In some embodiments where the active region 204 includes alternatingly stacked layers of silicon layer 2041 and germanium layers 2042, the germanium layers 2042 exposed in the gate trenches 220 are selectively removed to form a plurality of channel members formed of the silicon layers 2041. Although only two silicon layers 2041 are shown in FIG. 8a, the present application is not so limited and may include more silicon layers 2041. In some embodiments, the channel members are elongated and the transistors formed according to the method 100 may be referred to as nano-wire GAA transistors. In some alternative embodiments, the channel members are plate-like and the transistor formed according to the method 100 may be referred to as nano-plate GAA transistors.

Referring to FIG. 1 and FIGS. 9a~9d, the method 100 includes a block 112 where a plurality of metal gate structures 227 are formed. At block 112, each of the plurality of metal gate structures 227 includes a gate dielectric layer 224 and a gate electrode 226 and may be formed by depositing one or more dielectric materials and one or more metal layers, followed by planarization to remove excess dielectric materials and the metal layers over the top surface of the ILD layer 210. The metal gate structures are formed over the substrate across various portions of the active region 204 and surround the channel members in the active region 204. In the example illustrated in FIG. 9d, the gate dielectric layer 224 surrounds each of the channel members formed of silicon layers 2041 and gate electrode 226 surrounds the gate dielectric layer 224. The one or more dielectric materials may include high-k dielectric materials, such as metal oxide, metal nitride, such as lanthanum oxide, aluminum oxide, zirconium oxide, titanium oxide, tantalum oxide, yttrium oxide, strontium titanate (STO), barium titanate, barium zirconate (BTO), barium zirconate, hafnium zirconate, hafnium silicate, hafnium lanthanide, lanthanum silicate, aluminum silicate, hafnium tantalate, hafnium titanate, barium strontium titanate, or other suitable dielectric materials, such as silicon nitride (SiN) and silicon oxynitride (SiON). In embodiments represented in FIG. 9d, the gate dielectric layer 224 is formed around the channel members formed of silicon layers 2041. The gate dielectric layer 224 may further includes an interfacial layer sandwiched between high-k dielectric layer and the active region 204. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques.

The gate electrode 226 may be formed around the gate dielectric layer 224 and may include titanium, silver, titanium aluminum nitride, tantalum carbide, tantalum carbonitride, tantalum silicon nitride, manganese, zirconium, titanium nitride, tantalum nitride, ruthenium, molybdenum, aluminum, tungsten oxide, copper, tungsten, or other any suitable conductive material. In some embodiments, different metals or metal nitrides are used for nFET and pFET devices to impart different work functions. The gate electrode 226 may include multiple conductive materials. In some embodiments, the gate electrode 226 may also include a capping layer, a first blocking layer, a work function metal layer, a second blocking layer and a filling metal layer. In furtherance of the embodiments, the capping layer includes titanium nitride, tantalum nitride, or other suitable material, formed by a proper deposition technique such as ALD. Each of the first and second blocking layers includes titanium nitride, tantalum nitride, or other suitable material, formed by a proper deposition technique such as ALD. In some examples, the block layers may not be present or only one of them is present in the gate electrode. The work function metal layer includes a conductive layer of metal or metal alloy with proper work function such that the corresponding FET is enhanced for its device performance. The work function (WF) metal layer is different for a pFET and a nFET, respectively referred to as an n-type WF metal and a p-type WF metal. The choice of the WF metal depends on the FET to be formed on the active region. For example, the semiconductor structure 200 includes a first active region for an nFET and a second active region for a pFET, and accordingly, the n-type WF metal and the p-type WF metal are respectively formed in the corresponding metal gate structures. Particularly, an n-type WF metal is a metal having a first work function such that the threshold voltage of the associated nFET is reduced. The work function of an n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The work function of a p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD. In various embodiments, the filling metal layer includes aluminum, tungsten or other suitable metal. The filling metal layer is deposited by a suitable technique, such as PVD or plating.

Referring to block 114 of FIG. 1 and FIGS. 10a~10d, the method 100 includes a block 114 where gate-cut openings 230 are formed. At block 114, the metal gate structures 227 are patterned by a procedure that includes lithography and etching. In the present embodiment, the block 114 includes forming a patterned hard mask 228 over the semiconductor structure 200 with gate-cut openings 230 that define the regions of the metal gate structures 227 to be cut; and then performing an etching process to the metal gate structures 227 using the hard mask 228 as an etch mask. The operations at block 114 forms gate-cut openings 230 in the metal gate structures 227. The hard mask 228 may include suitable materials, such as silicon oxide, silicon nitride, silicon oxynitride, other suitable dielectric material, or a combination thereof. The hard mask 222 is formed by depositing a hard mask; forming a patterned resist layer by lithography, and etching the hard mask within the openings of the patterned resist layer. The etching process applied to the metal gate structures 227 may include multiple etching steps with etchants to respective gate materials, and may include wet etching, dry etching, or a combination thereof.

Block 114 of method 100 may include various embodiments. In some embodiments represented in FIG. 10c, the gate-cut openings 230 sever the metal gate structures 227, including the gate dielectric layer 224 and the gate electrode 226, such that both gate dielectric layer 224 and the gate electrode 226 are exposed within the gate-cut openings 230. Additionally, the formation of the gate-cut openings 230 remove the first dielectric layer 216 to expose the second dielectric layer 218 in the gate-cut openings. In these embodiments, as illustrated in FIG. 10c, a length of the channel isolation feature 219 along Y direction (Y1) is defined between two gate-cut openings 230. The present application is not so limited. In some other embodiments, the gate-cut openings 230 do not extend across the channel isolation features 219 and two ends of the channel isolation features 219 abut gate dielectric layer 224 of a metal gate structure 227. That is, in those embodiments, the gate-cut openings 230 terminate before it reaches a channel isolation feature 219. In still other embodiments, the first dielectric layer 216 is not removed and the gate-cut openings 230 is not rectangular in shape. In these embodiments, the gate-cut opening 230 may extend into the channel isolation feature 219 or the channel isolation feature 219 may extend into the gate-cut openings 230.

Referring to block 116 of FIG. 1 and FIGS. 11a~11d, the method 100 includes a block 116 where a dielectric material is deposited in the gate-cut openings 230 to form gate-cut features 232. In the present embodiment, the formation of the gate-cut features 232 includes deposition and may further include a CMP process after the deposition. The deposition process may deposit any suitable dielectric material in the gate-cut openings 230 using a suitable deposition technique, such as CVD, flowable chemical vapor deposition (FCVD), high density plasma CVD (HDPCVD), other suitable technique or a combination thereof. After the formation of the gate-cut features 232, the block 116 may include a CMP process such that a top surface of the gate-cut features 232 are coplanar with top surfaces of the metal gate structures 27 and the ILD layer 210.

Referring to block 118 of FIG. 1, the method 100 includes a block 118 where further processes are performed. These further processes may include formation of interconnect structures, gate contacts, and source/drain contacts. For example, another ILD layer may be formed over the semiconductor structure 200 and gate contacts or source/drain contacts may be formed.

Figure 12:
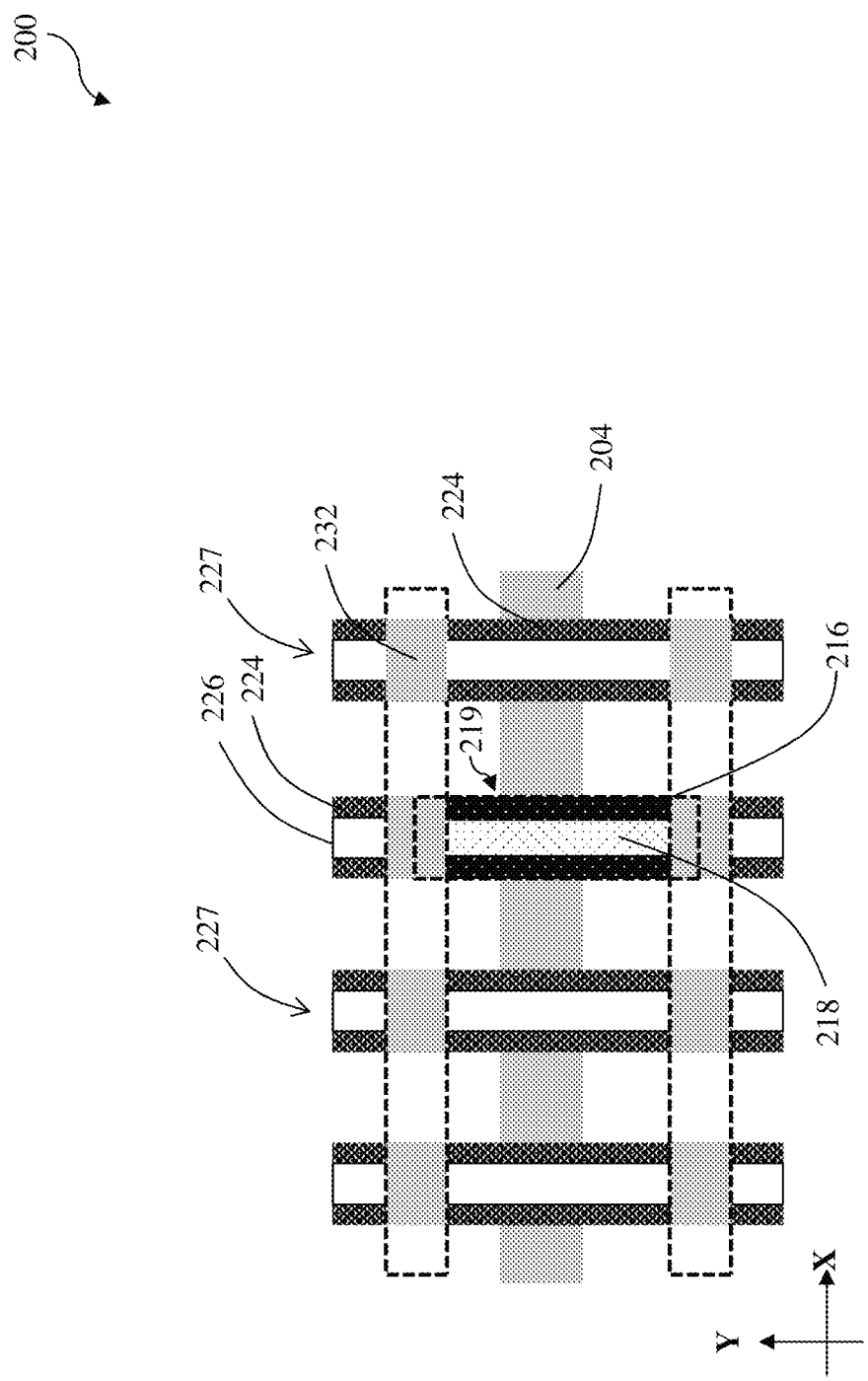
FIGS. 12-17 are diagrammatic top views of semiconductor structures constructed according to various embodiments of the present disclosure.

References are now made to FIGS. 12-17. As described above with respect to blocks 108 and 114 of the method 100, the present disclosures disclose various embodiments regarding the formation of the gate trenches 220 and gate-cut openings 230. These various embodiments may result in various semiconductor structures 200. Referring now to FIG. 12, in embodiments where formation of the gate-cut openings 230 removes the gate dielectric layer 224 and exposes the second dielectric layer 218 of the channel isolation feature 219, the gate-cut features 232 are in direct contact with the gate dielectric layer 224, the gate electrode 226, the first dielectric layer 216, and the second dielectric layer 218. That is, the channel isolation feature 219 in the semiconductor structure 200 includes the second dielectric layer 218 that is shielded by the first dielectric layer 216 from the active region 204, the ILD layer 210 (not shown in FIG. 12 for simplicity), and the STI feature 203. The gate-cut features 232 have a uniform width along the Y direction and are aligned along the X direction.

Figure 13:
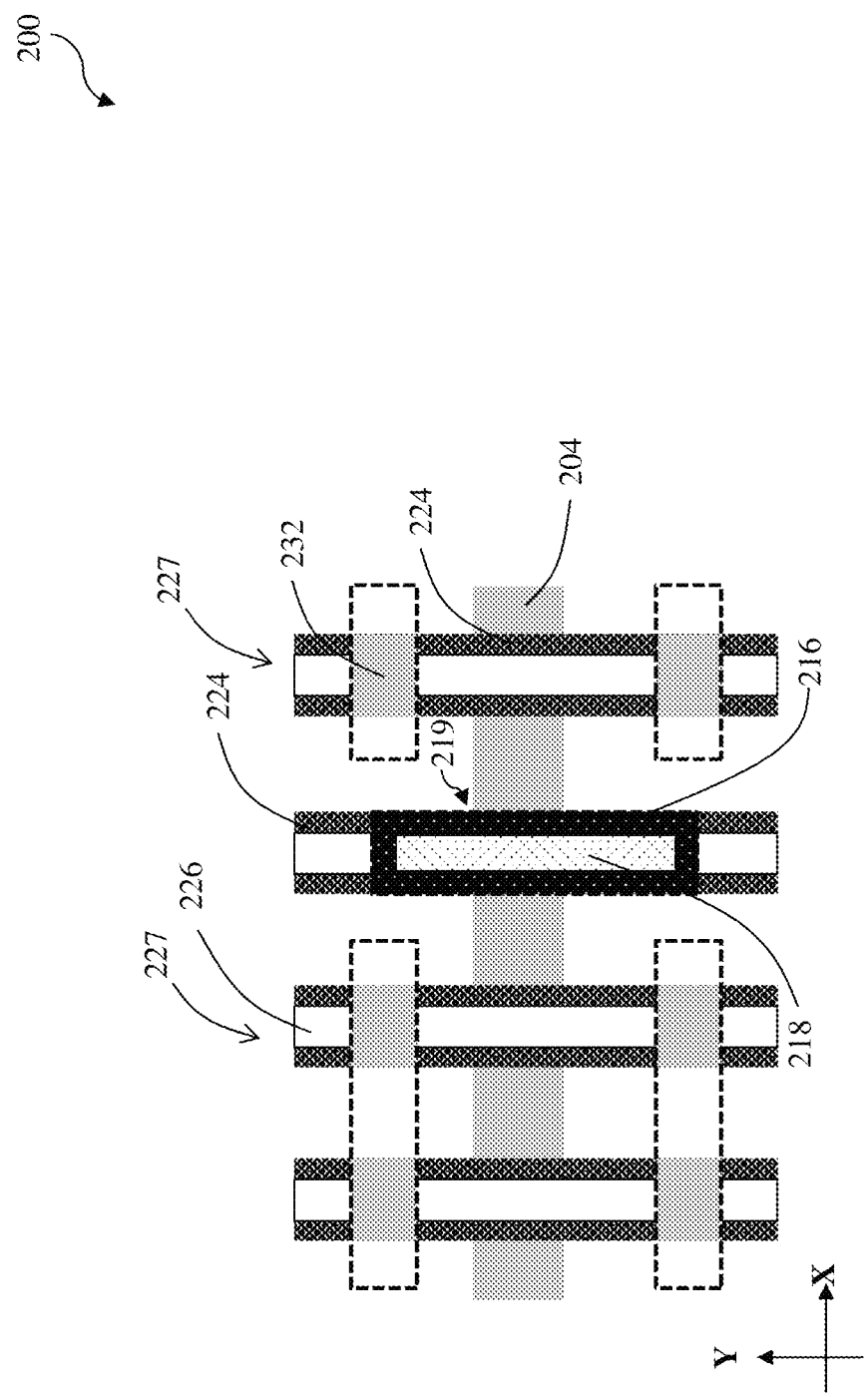
Figure 14:
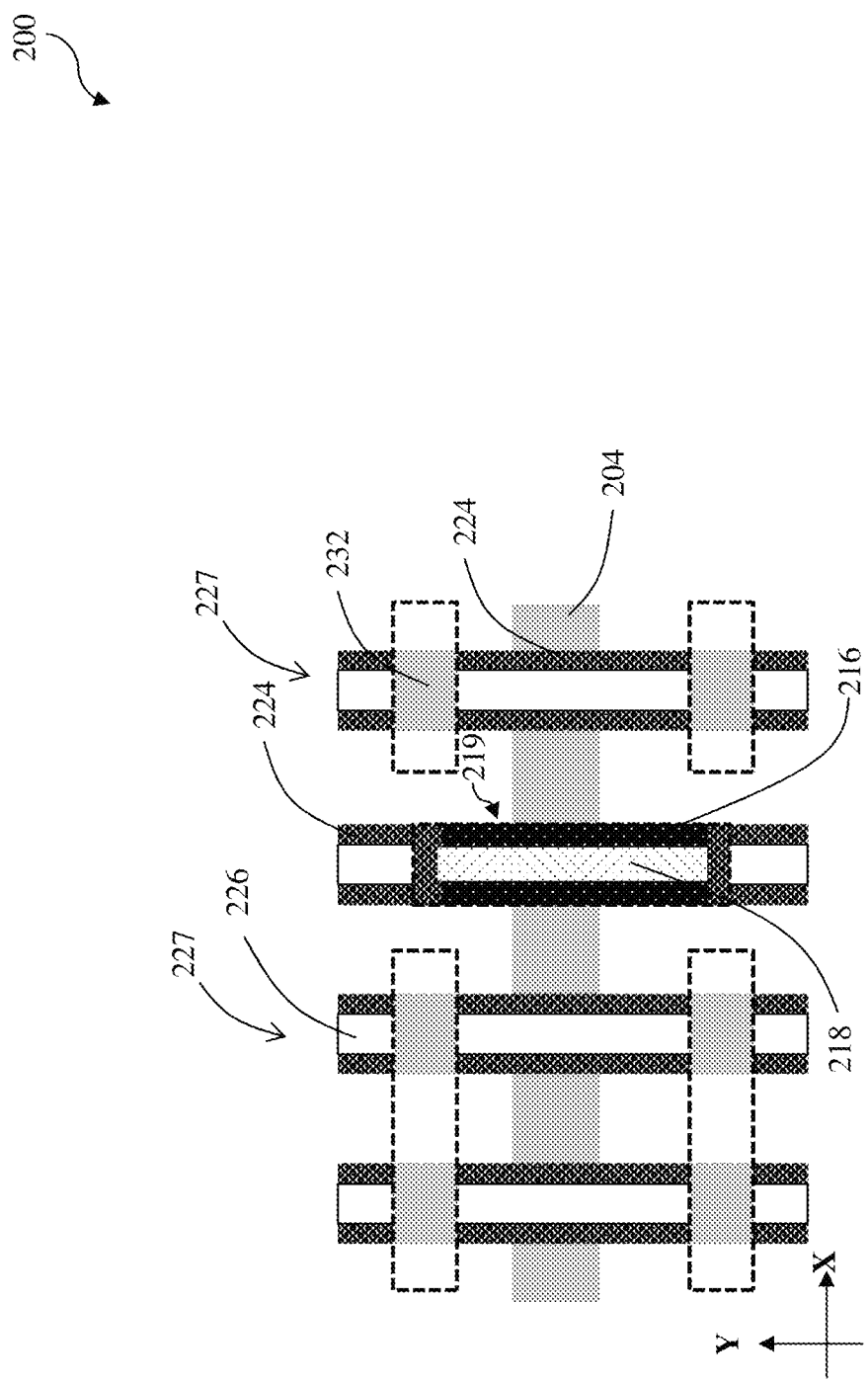

Referring now to FIGS. 13 and 14, in some embodiments, the gate-cut openings 230 do not extend across the channel isolation feature 219. In these embodiments, depending on whether the first dielectric layer 216 is etched when the gate trench 220 are formed, the second dielectric layer of the channel isolation feature 219 may be in contact with the gate electrode 226, as illustrated in FIG. 13, or the gate dielectric layer 224 is in contact with the second dielectric layer 218, as shown in FIG. 14.

Figure 15:
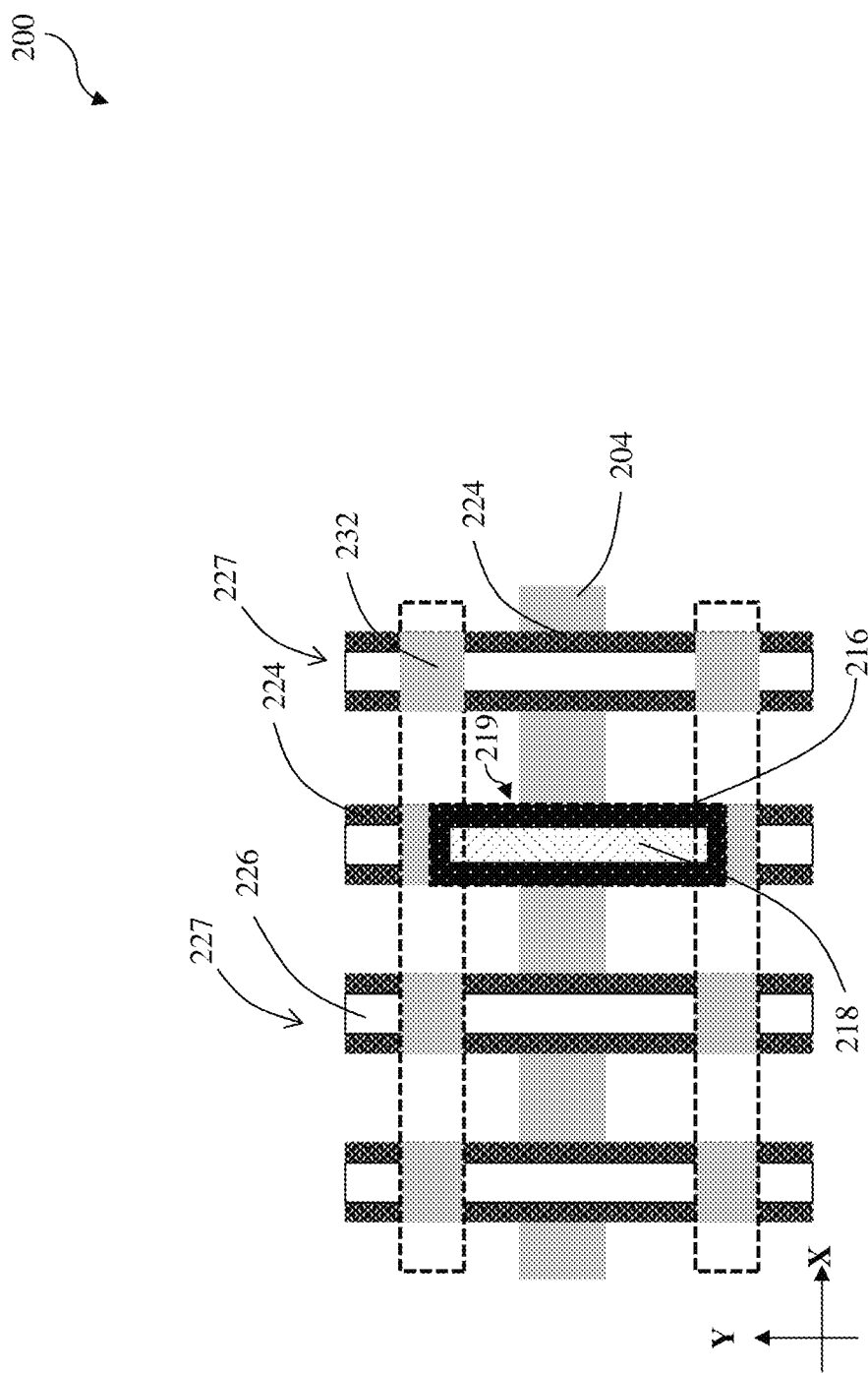
Figure 16:
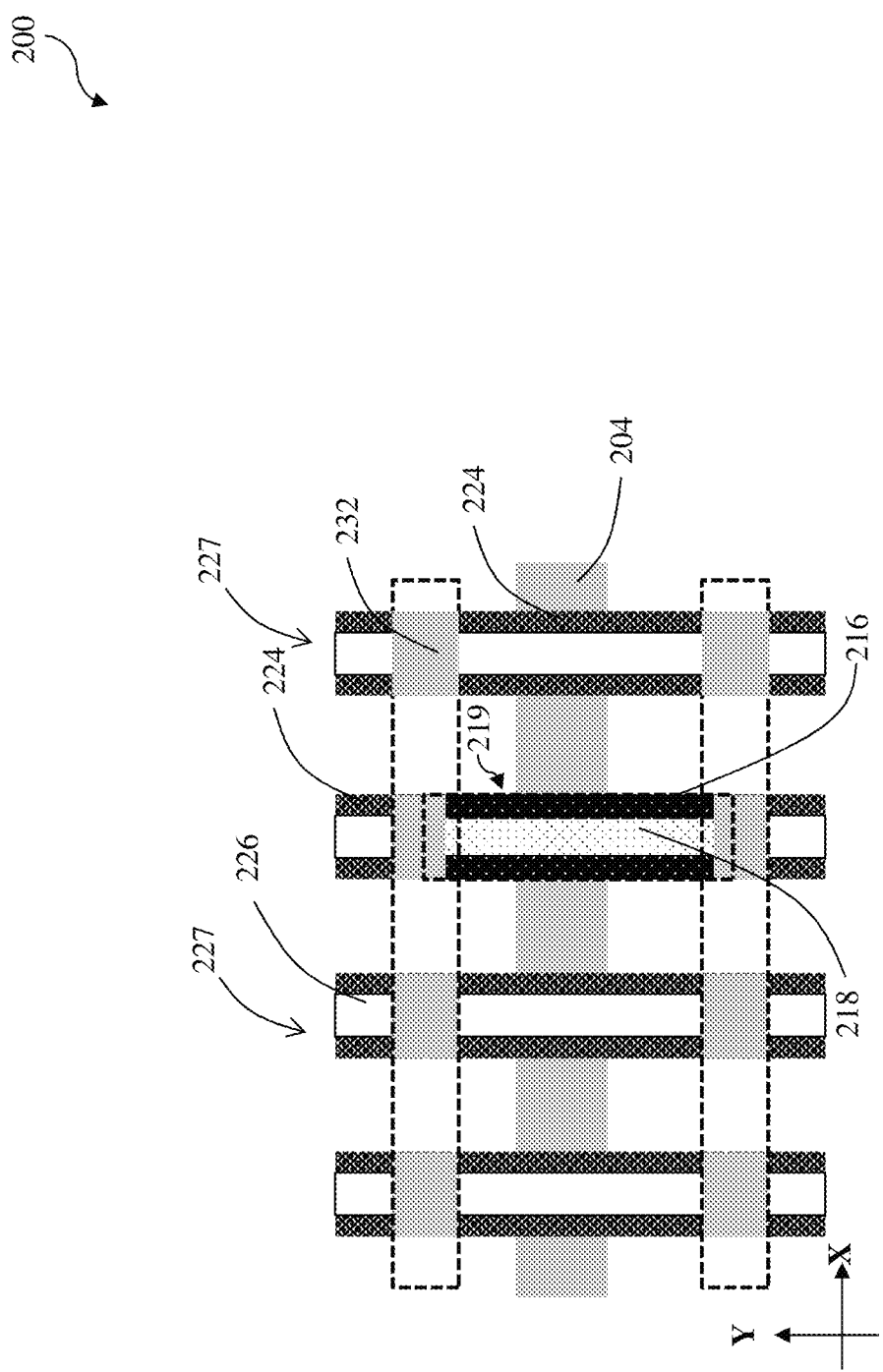

Referring now to FIG. 15, in some implementations, the formation of the gate-cut openings 230 may leave the second dielectric layer 218 of the channel isolation feature 219 substantially unetched and only remove the gate dielectric layer 224. In these implementations, the second dielectric layer 218 may be in contact with the gate-cut features 232 and the gate electrode 226 may be in contact with the gate-cute features 232. In these implementations, the channel isolation feature 219 extends into the gate-cut features 232 and the gate-cut features 232 adjacent a channel isolation features 219 may be shorter in length along the Y direction as compared to gate-cut features 232 not adjacent a channel isolation feature 219. Referring now to FIG. 16, in some other implementations, the second dielectric layer 218 may be removed to expose the first dielectric layer 216. The channel isolation feature 219 still extend into the gate-cut features 232. In these implementations, the gate-cut feature 232 are in direct contact with the first dielectric layer 216 and the gate electrode 226. As illustrated in FIGS. 15 and 16, when the channel isolation feature 219 extends into the gate-cut feature 232, the gate-cute features 232 are not aligned along the X direction.

Figure 17:
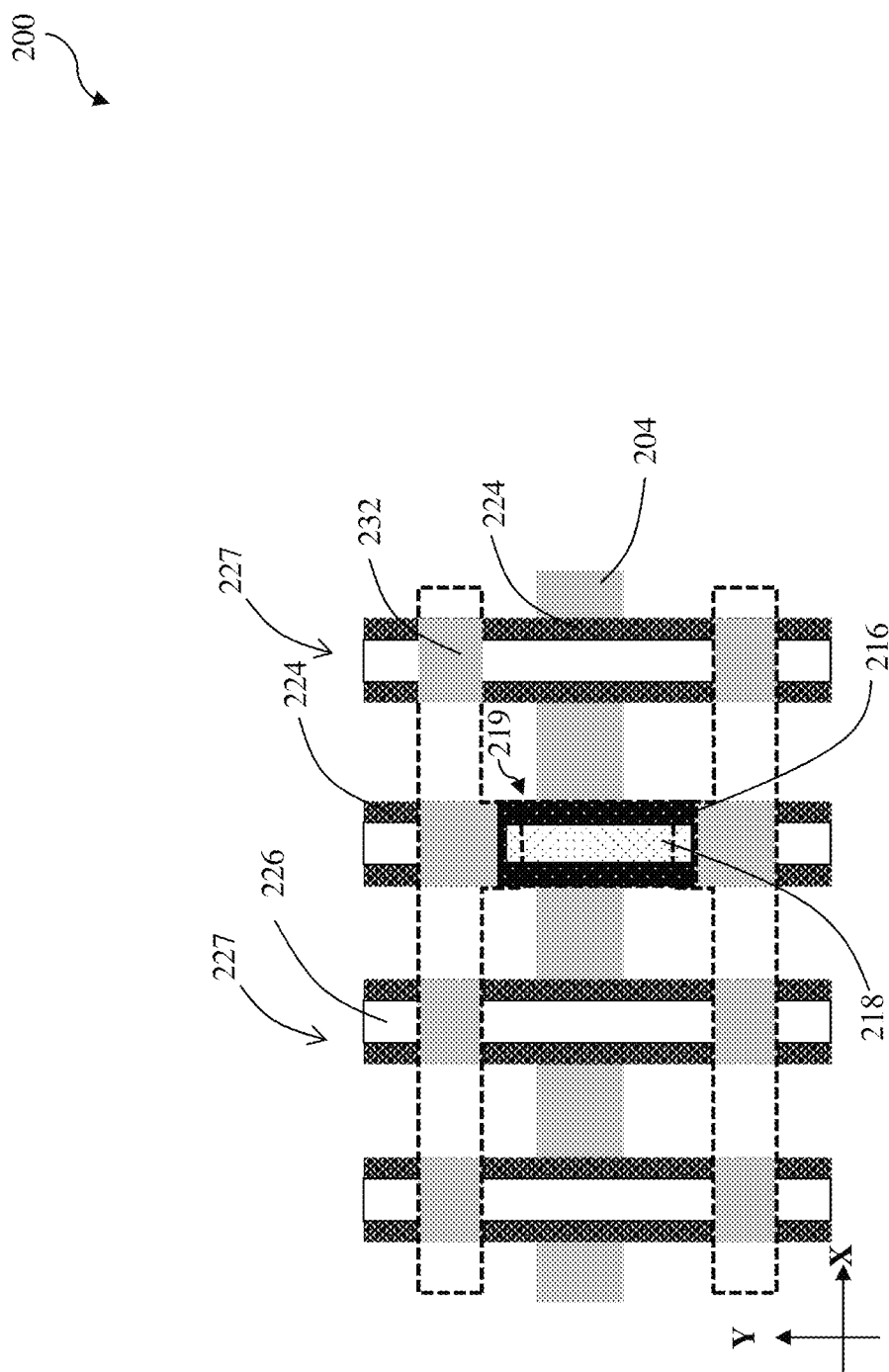

Referring now to FIG. 17, in some alternative embodiments, the second dielectric layer 218 of the channel isolation feature 219 is only partially removed and the gate-cute feature 232 extends into the second dielectric layer 218 such that the gate-cute feature 232 adjacent the channel isolation feature 219 is longer in length along the Y direction is greater than a width of the gate.

Based on the above discussions, it can be seen that the present disclosure offers advantages over conventional methods and semiconductor structures. It is understood, however, that other embodiments may offer additional advantages, and not all advantages are necessarily disclosed herein, and that no particular advantage is required for all embodiments. For example, the present disclosure provides a method where the channel isolation features are formed before formation of the metal gates and gate-cut features are formed after formation of the metal gates. The method of the present application avoids forming gate-cut openings through a stack of gate electrodes, gate dielectric layers, and channel members and can enlarge the fill window of metal gate structures to improve device performance and production yield. The method of the present application may result in semiconductor structures where the gate-cut feature is in direct contact with the second dielectric layer of the channel isolation feature and the gate electrode in some embodiments.

Thus, the present disclosure provides a semiconductor structure in accordance with some embodiments. The semiconductor structure includes a first active region over a substrate and extending along a first direction, a gate structure over the first active region and extending along a second direction substantially perpendicular to the first direction, a gate-cut feature abutting an end of the gate structure, and a channel isolation feature extending along the second direction and between the first active region and a second active region. The gate structure includes a metal electrode in direct contact with the gate-cut feature. The channel isolation feature includes a liner on sidewalls extending along the second direction and a dielectric fill layer between the sidewalls. The gate-cut feature abuts an end of the channel isolation feature and the dielectric fill layer is in direct contact with the gate-cut feature.

In some embodiments, the gate-cut feature includes silicon nitride, silicon oxynitride, silicon oxide, silicon oxycarbonitride, silicon carbonitride, silicon oxycarbide, or a combination thereof. In some implementations, the channel isolation feature includes silicon nitride, silicon oxynitride, silicon oxide, silicon oxycarbonitride, silicon carbonitride, silicon oxycarbide, or a combination thereof. In some instances, the liner includes silicon oxide and the dielectric fill layer includes silicon nitride, silicon oxynitride, silicon oxycarbonitride, silicon carbonitride, silicon oxycarbide, or a combination thereof. In some embodiments, a width of the gate-cut feature is uniform along the second direction. In some embodiments, the first active region includes a first plurality of channel members, the second active region includes a second plurality of channel members, and the channel isolation feature isolates the first plurality of channel members from the second plurality of channel members. In some instances, the first plurality of channel members is surrounded by the gate structure.

The present disclosure provides a semiconductor structure in accordance with other embodiments. The semiconductor structure includes a first active region over a substrate and extending along a first direction, a first gate structure over the first active region and extending along a second direction substantially perpendicular to the first direction, a gate-cut feature abutting an end of the first gate structure, and a channel isolation feature extending along the second direction between a second gate structure and a third gate structure. The channel isolation feature is disposed between the first active region and a second active region extending along the first direction. The second and third gate structure includes a gate dielectric layer and the channel isolation feature includes a liner on sidewalls on and a dielectric fill layer surrounded by the sidewalls. The liner of the channel isolation feature is in direct contact with the gate dielectric layer of the second and third gate structures.

In some embodiments, the gate-cut feature includes silicon nitride, silicon oxynitride, silicon oxide, silicon oxycarbonitride, silicon carbonitride, silicon oxycarbide, or a combination thereof and the channel isolation feature includes silicon nitride, silicon oxynitride, silicon oxide, silicon oxycarbonitride, silicon carbonitride, silicon oxycarbide, or a combination thereof. In some implementations, the liner includes silicon oxide and the dielectric fill layer includes silicon nitride, silicon oxynitride, silicon oxycarbonitride, silicon carbonitride, silicon oxycarbide, or a combination thereof. In some implementations, the gate-cut feature terminates before it reaches the channel isolation feature. In some embodiments, the first active region includes a first plurality of channel members, the second active region includes a second plurality of channel members, and the channel isolation feature isolates the first plurality of channel members from the second plurality of channel members. In some instances, the first plurality of channel members is surrounded by the first gate structure.

The present disclosure also provides a method of forming an integrated circuit structure in accordance with some embodiments. The method includes providing a semiconductor structure including a first active region and a plurality of dummy gate structures over the first active region, forming a channel isolation feature to separate the first active region into a first segment and a second segment, after the forming of the channel isolation feature, removing the plurality of dummy gate structures, patterning the first active region to form a plurality of channel members, forming a plurality of gate structures over the semiconductor structure to wrap around the plurality of channel members, etching the plurality of gate structures to form a gate-cut opening, and depositing a dielectric material in the gate-cut opening to form a gate-cut feature.

In some embodiments, the first active region includes a plurality of silicon layers interleaved with a plurality of germanium layers and the patterning of the first active region includes selectively removing the plurality of germanium layers. In some implementations, the forming of the plurality of gate structures includes depositing a gate dielectric layer, an depositing a gate electrode over the gate dielectric layer. In some implementations, the forming of the channel isolation feature includes recessing a second active region parallel to the first active region to form a channel isolation trench, depositing a liner in the channel isolation trench, depositing a dielectric fill layer over the liner deposited in the channel isolation trench, and planarizing a top surface of the semiconductor structure. The recessing of the second active region includes recessing the first active region under the second active region.

In some embodiments, the liner includes silicon oxide and the dielectric fill layer includes silicon nitride, silicon oxynitride, silicon oxycarbonitride, silicon carbonitride, silicon oxycarbide, or a combination thereof. In some implementations, the dielectric fill layer consists essentially of the dielectric material. In some instances, the forming of the plurality of gate structures includes depositing a gate dielectric layer, and depositing a gate electrode over the gate dielectric layer. The etching of the plurality of gate structures includes etching the liner, the dielectric fill layer, the gate dielectric layer, and the gate electrode.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a first active region over a substrate and extending along a first direction;
   a first gate structure over the first active region and extending along a second direction substantially perpendicular to the first direction;
   a gate-cut feature abutting an end of the first gate structure; and
   a channel isolation feature extending along the second direction between a second gate structure and a third gate structure,
   wherein the channel isolation feature is disposed between the first active region and a second active region extending along the first direction,
   wherein the second and third gate structure comprises a gate dielectric layer,
   wherein the channel isolation feature includes a liner and a dielectric fill layer disposed over the liner,
   wherein the liner of the channel isolation feature is in direct contact with the gate dielectric layer of the second and third gate structures.

2. The semiconductor structure of claim 1, wherein the gate-cut feature comprises silicon nitride, silicon oxynitride, silicon oxide, silicon oxycarbonitride, silicon carbonitride, silicon oxycarbide, or a combination thereof and the channel isolation feature comprises silicon nitride, silicon oxynitride, silicon oxide, silicon oxycarbonitride, silicon carbonitride, silicon oxycarbide, or a combination thereof.

3. The semiconductor structure of claim 1, wherein the liner comprises silicon oxide and the dielectric fill layer comprises silicon nitride, silicon oxynitride, silicon oxycarbonitride, silicon carbonitride, silicon oxycarbide, or a combination thereof.

4. The semiconductor structure of claim 1, wherein the gate-cut feature terminates before it reaches the channel isolation feature.

5. The semiconductor structure of claim 1,
   wherein the first active region comprises a first plurality of channel members,
   wherein the second active region comprises a second plurality of channel members,
   wherein the channel isolation feature isolates the first plurality of channel members from the second plurality of channel members.

6. The semiconductor structure of claim 5, wherein the first plurality of channel members is surrounded by the first gate structure.

7. A semiconductor structure, comprising:
   a first active region over a substrate and extending along a first direction;
   a first gate structure over the first active region and extending along a second direction substantially perpendicular to the first direction;
   a gate-cut feature abutting an end of the first gate structure; and
   an isolation feature extending along the second direction and between the first active region and a second active region, the isolation feature abutting a second gate structure that extends along the second direction, wherein the first gate structure includes a metal electrode in direct contact with the gate-cut feature, wherein the isolation feature includes a liner on sidewalls extending along the second direction and a dielectric fill layer between the sidewalls, wherein the second gate structure includes a gate dielectric layer in direct contact with the dielectric fill layer and the liner.

8. The semiconductor structure of claim 7, wherein the gate-cut feature comprises silicon nitride, silicon oxynitride, silicon oxide, silicon oxycarbonitride, silicon carbonitride, silicon oxycarbide, or a combination thereof.

9. The semiconductor structure of claim 7, wherein the isolation feature comprises silicon nitride, silicon oxynitride, silicon oxide, silicon oxycarbonitride, silicon carbonitride, silicon oxycarbide, or a combination thereof.

10. The semiconductor structure of claim 7, wherein the liner comprises silicon oxide and the dielectric fill layer comprises silicon nitride, silicon oxynitride, silicon oxycarbonitride, silicon carbonitride, silicon oxycarbide, or a combination thereof.

11. The semiconductor structure of claim 7, wherein a width of the gate-cut feature is uniform along the second direction.

12. The semiconductor structure of claim 7, wherein the first active region comprises a first plurality of channel members stacked vertically one over another, wherein the second active region comprises a second plurality of channel members stacked vertically one over another, wherein the isolation feature isolates the first plurality of channel members from the second plurality of channel members.

13. The semiconductor structure of claim 12, wherein the first plurality of channel members is surrounded by the first gate structure.

14. A semiconductor structure, comprising:

a first active region and a second active region over a substrate and aligned along a first direction;

a first gate structure over the first active region and comprising a gate dielectric layer and a gate electrode layer;

a gate-cut feature extending along the first direction and abutting an end of the first gate structure; and an isolation feature extending lengthwise along a second direction substantially perpendicular to the first direction and abutting a second gate structure extending lengthwise along the second direction, wherein the isolation feature separates the first active region from the second active region extending along the first direction, wherein the gate dielectric layer and the gate electrode layer of the first gate structure are in direct contact with the gate-cut feature, wherein the isolation feature includes a dielectric fill layer and a liner extending along sidewalls and a bottom surface of the dielectric fill layer, wherein the liner and the dielectric fill layer of the isolation feature is in direct contact with a gate dielectric layer of the second gate structure and is spaced apart from a gate electrode of the second gate structure.

15. The semiconductor structure of claim 14, wherein the first active region comprises a first plurality of channel members stacked vertically one over another, wherein the second active region comprises a second plurality of channel members stacked vertically one over another, wherein the isolation feature isolates the first plurality of channel members from the second plurality of channel members.

16. The semiconductor structure of claim 14, wherein the isolation feature extends between the second gate structure and a third gate structure along the second direction.

17. The semiconductor structure of claim 16, wherein the isolation feature, the second gate structure and the third gate structure are aligned along the second direction.

18. The semiconductor structure of claim 16, wherein the gate-cut feature terminates before it reaches the second gate structure.

19. The semiconductor structure of claim 16, wherein the dielectric fill layer of the isolation feature is spaced apart from a gate electrode layer of the second gate structure and a gate electrode layer of the third gate structure.

20. The semiconductor structure of claim 19, wherein the liner comprises silicon oxide and the dielectric fill layer comprises silicon nitride, silicon oxynitride, silicon oxycarbonitride, silicon carbonitride, silicon oxycarbide, or a combination thereof.

* * * * *